United States Patent
Ohmori et al.

(10) Patent No.: US 10,354,708 B2
(45) Date of Patent: Jul. 16, 2019

(54) STORAGE DEVICE, MANUFACTURING METHOD THEREFOR, AND STORAGE APPARATUS

(71) Applicant: SONY CORPORATION, Tokyo (JP)

(72) Inventors: Hiroyuki Ohmori, Kanagawa (JP);
Masanori Hosomi, Tokyo (JP);
Kazuhiro Bessho, Kanagawa (JP);
Yutaka Higo, Kanagawa (JP);
Kazutaka Yamane, Kanagawa (JP);
Hiroyuki Uchida, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 15/553,769

(22) PCT Filed: Jan. 19, 2016

(86) PCT No.: PCT/JP2016/000238
§ 371 (c)(1),
(2) Date: Aug. 25, 2017

(87) PCT Pub. No.: WO2016/139879
PCT Pub. Date: Sep. 9, 2016

(65) Prior Publication Data
US 2018/0190335 A1 Jul. 5, 2018

(30) Foreign Application Priority Data
Mar. 5, 2015 (JP) .................................. 2015-043850

(51) Int. Cl.
*G11C 11/16* (2006.01)
*H01L 43/08* (2006.01)
(Continued)

(52) U.S. Cl.
CPC .......... *G11C 11/161* (2013.01); *G11B 5/3906* (2013.01); *G11C 11/5607* (2013.01);
(Continued)

(58) Field of Classification Search
CPC . G11C 11/161; G11C 11/5607; G11B 5/3906; H01F 10/32
(Continued)

(56) References Cited

U.S. PATENT DOCUMENTS

2010/0032777 A1* 2/2010 Gao .................... B82Y 25/00
257/421

FOREIGN PATENT DOCUMENTS

JP  2008-171882 A  7/2008
JP  2012-008538 A  1/2012
(Continued)

OTHER PUBLICATIONS

International Search Report and Written Opinion of PCT Application No. PCT/JP2016/000238, dated Mar. 1, 2016, 02 pages of English Translation and 07 pages of ISRWO.

(Continued)

*Primary Examiner* — Anthan Tran
(74) *Attorney, Agent, or Firm* — Chip Law Group

(57) ABSTRACT

A storage device according to one embodiment of the present technology includes a magnetization fixed layer, an intermediate layer, and a storage layer. The magnetization fixed layer is configured to have magnetization in an orientation perpendicular to a film surface and a constant magnetization direction. The intermediate layer includes a nonmagnetic body and is disposed on the magnetization fixed layer. The storage layer includes an outer circumferential portion and a center portion, is disposed to face the magnetization fixed layer with the intermediate layer sandwiched therebetween, and is configured to have a variable magnetization direction, the outer circumferential portion having magnetization in an orientation perpendicular to a film surface, the center portion being formed by being surrounded by the outer circumferential portion and having magnetization inclined from the orientation perpendicular to the film surface.

10 Claims, 18 Drawing Sheets

(51) Int. Cl.
*H01L 43/10* (2006.01)
*H01L 43/12* (2006.01)
*G11B 5/39* (2006.01)
*G11C 11/56* (2006.01)
*H01F 10/32* (2006.01)
*H01L 27/22* (2006.01)

(52) U.S. Cl.
CPC ............. *H01F 10/32* (2013.01); *H01L 27/22* (2013.01); *H01L 43/08* (2013.01); *H01L 43/10* (2013.01); *H01L 43/12* (2013.01)

(58) Field of Classification Search
USPC ......................................................... 365/158
See application file for complete search history.

(56) References Cited

FOREIGN PATENT DOCUMENTS

| | | |
|---|---|---|
| JP | 2012-064901 A | 3/2012 |
| JP | 2013-069788 A | 4/2013 |
| JP | 2013-093349 A | 5/2013 |
| JP | 2013-115299 A | 6/2013 |

OTHER PUBLICATIONS

L. Berger, "Emission of Spin Waves by a Magnetic Multilayer Traversed by a Current", 1996 The American Physical Society, vol. 54, No. 13, 1996, 9353-9358 pages.

J.C. Slonczewski, "Current-driven Excitation of Magnetic Multilayers", Journal of Magnetism and Magnetic Materials 159 (1996) L1-L7, 07 pages.

\* cited by examiner

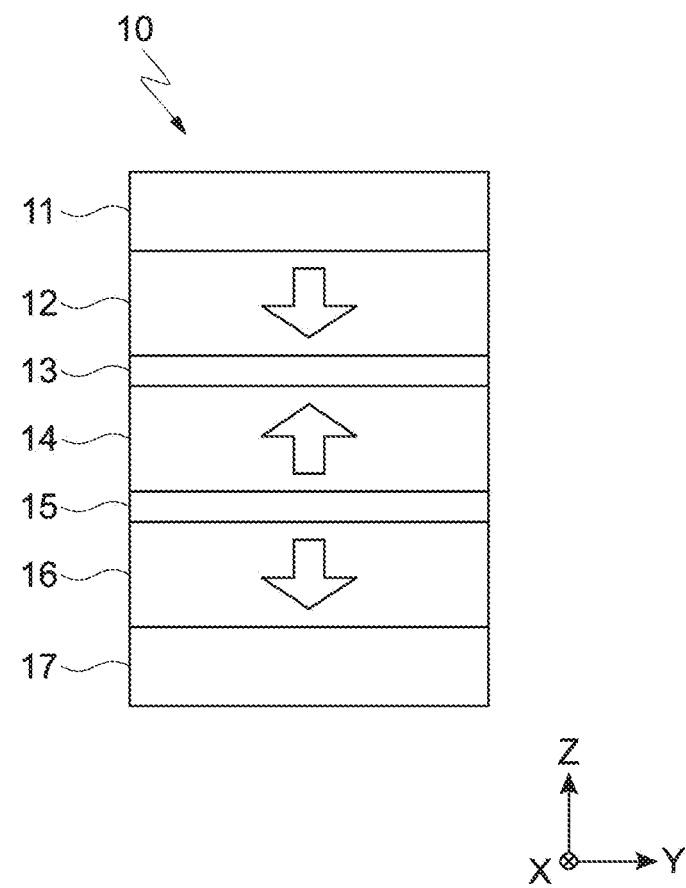
FIG.3
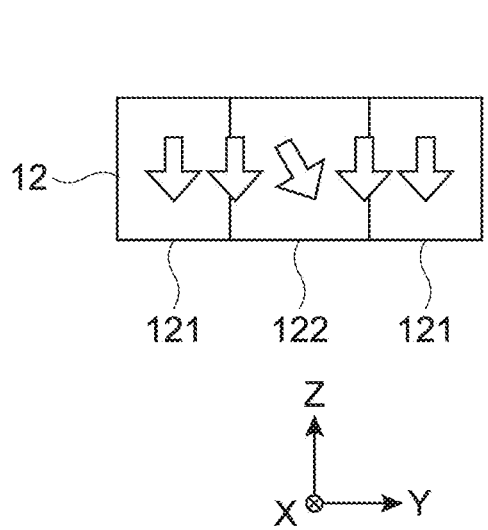
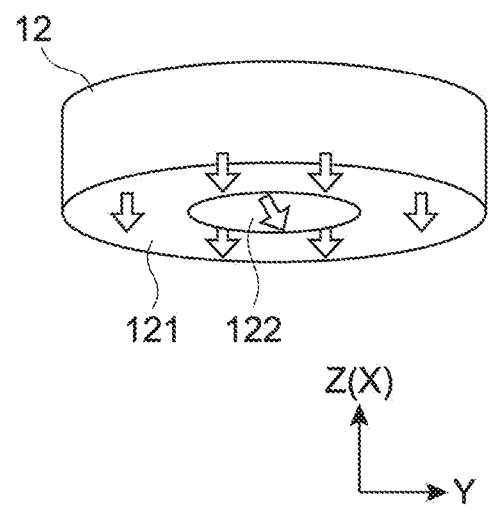

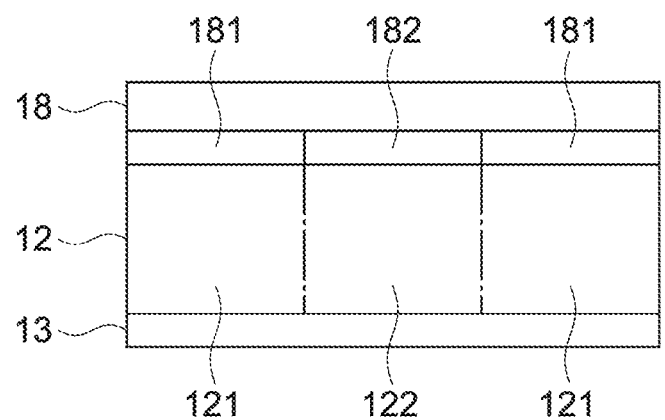
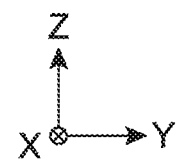
FIG.5

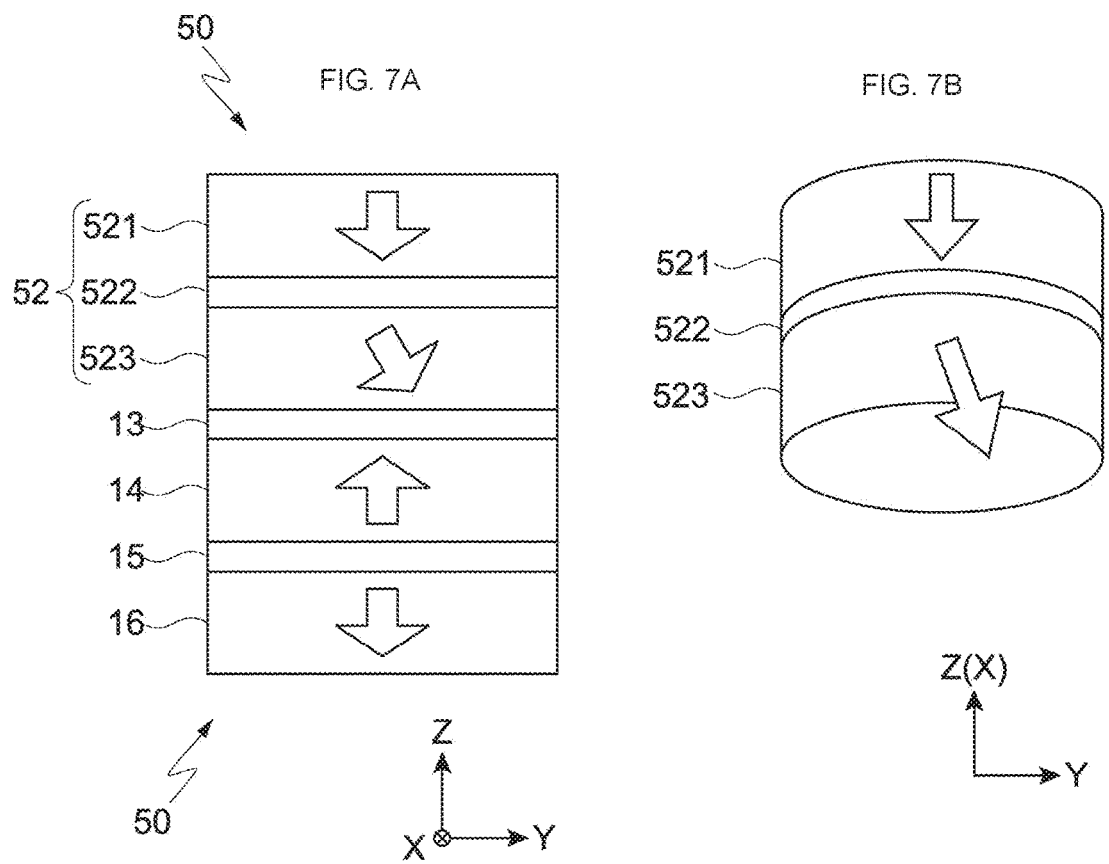
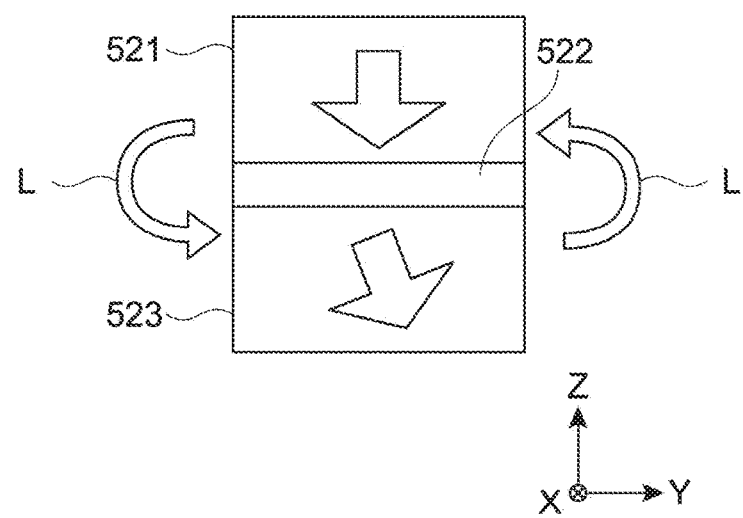
FIG.8

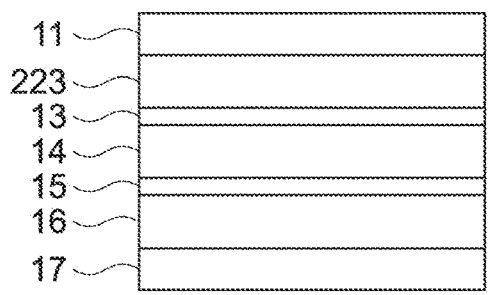
FIG. 11A
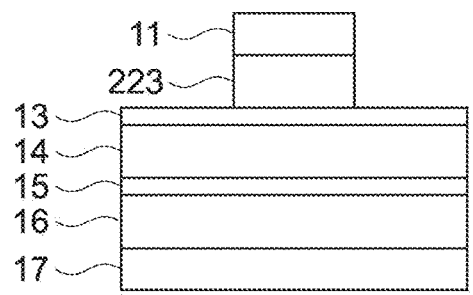
FIG. 11B
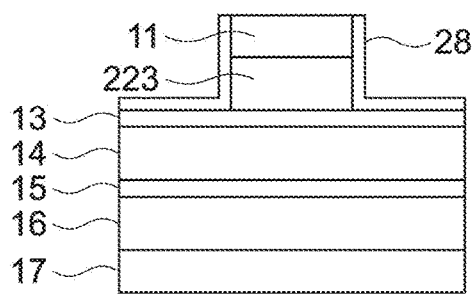
FIG. 11C
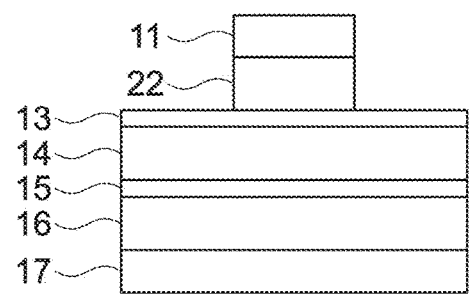
FIG. 11D
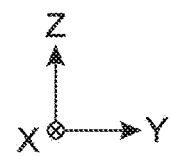

FIG. 16A
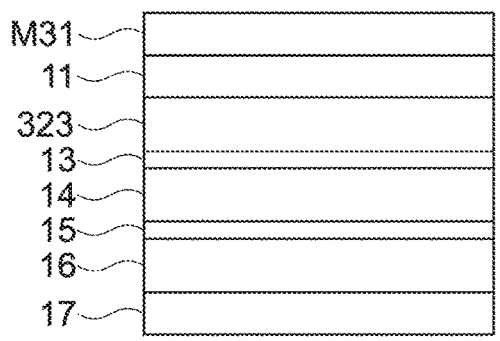
FIG. 16B
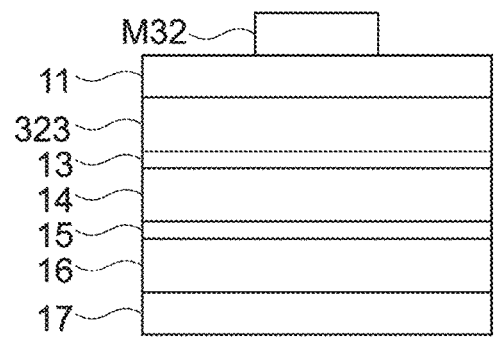
FIG. 16C
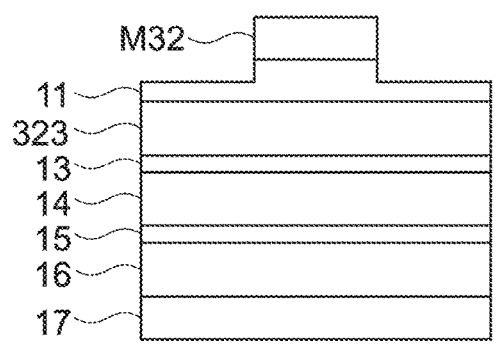
FIG. 16D
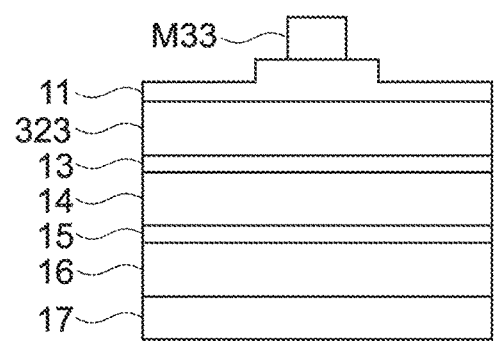
FIG. 16E
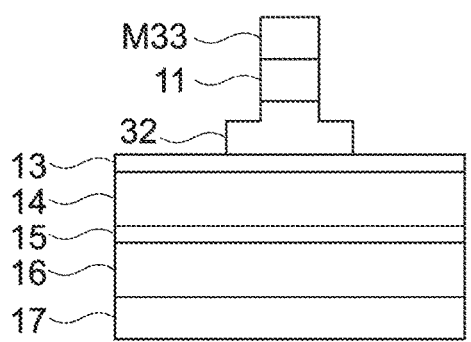
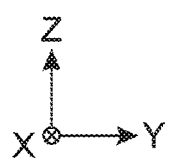

FIG. 21A
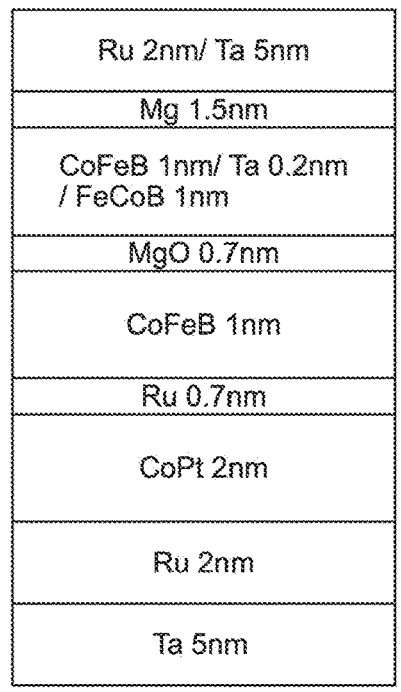
FIG. 21B
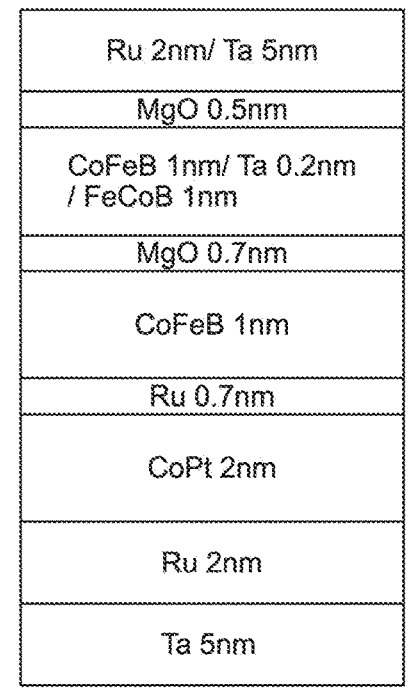
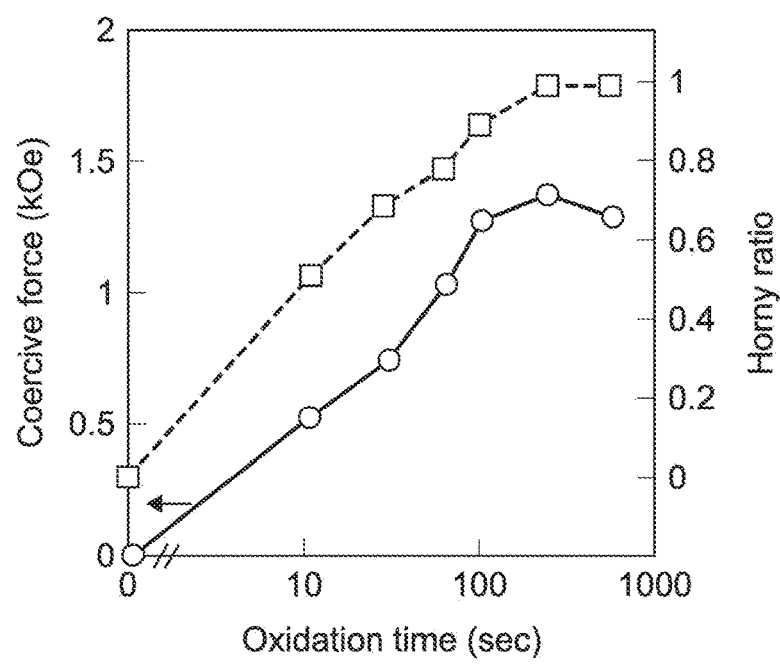
FIG.22

STORAGE DEVICE, MANUFACTURING METHOD THEREFOR, AND STORAGE APPARATUS

CROSS REFERENCE TO RELATED APPLICATIONS

This application is a U.S. National Phase of International Patent Application No. PCT/JP2016/000238 filed on Jan. 19, 2016, which claims priority benefit of Japanese Patent Application No. JP 2015-043850 filed in the Japan Patent Office on Mar. 5, 2015. Each of the above-referenced applications is hereby incorporated herein by reference in its entirety.

TECHNICAL FIELD

The present technology relates to a storage device that performs recording using spin torque magnetization reversal, a manufacturing method therefor, and a storage apparatus.

BACKGROUND ART

Various types of information equipment ranging from a large-capacity server to a mobile terminal have been drastically developed. Along with this development, there have been pursuits for even higher performances in memories or logic devices that constitute information equipment, and non-volatile semiconductor memories or the like are being developed.

In particular, among those non-volatile semiconductor memories, an MRAM (Magnetic Random Access Memory) is capable of high-speed and almost infinite ($10^{15}$ times or more) rewriting, because data storage is performed by way of the direction of magnetization of a magnetic body. It is expected that the MRAM will be developed in the future for code storage or working memories because of high speed operation and reliability thereof.

Meanwhile, the MRAM has had a difficulty in lowering power consumption or increasing capacity because magnetization is reversed by a current magnetic field generated from wiring.

As one method to solve the problem, there has been studied recording without the use of a current magnetic field, that is, a magnetization reversal system. In particular, researches on spin torque magnetization reversal are active (see, for example, Non-Patent Literatures 1 and 2).

A storage device using the spin torque magnetization reversal is typically constituted of an MTJ (Magnetic Tunnel Junction) (TMR (Tunneling Magnetoresistive)) device.

The configuration thereof uses the fact that a spin polarized electron that passes through a magnetic layer fixed in a certain direction gives, when entering another free magnetic layer (with a direction unfixed), torque to the magnetic layer (this is also called spin injection torque). Feeding a current of a certain threshold value or more allows the free magnetic layer to be reversed. Rewriting of 0/1 is performed by changing a polarity of a current. Hereinafter, an MRAM using the spin torque magnetization reversal will be referred to as an ST-MRAM (Spin Torque-Magnetic Random Access Memory). The spin torque magnetization reversal is also referred to as spin injection magnetization reversal. There is a great expectation about the ST-MRAM as a non-volatile memory that enables low power consumption and large capacity while maintaining advantages of the MRAM, that is, high-speed and almost infinite times of rewriting.

By the way, in the ST-MRAM, time for spin torque magnetization reversal largely depends on an initial angle of magnetization at the time when the application of a current starts. In other words, the initial angle of magnetization varies because of thermal fluctuation or the like, and thus the time for magnetization reversal varies. As a result, in order to reliably perform magnetization reversal, it is necessary to elongate a write pulse or increase a voltage, and there may be concern about lowering in write speed, increase in power consumption, or the like.

In this regard, there is conceived a method of providing a two-layer configuration including a layer of an in-plane magnetization film and a layer of a perpendicular magnetization film, coupling those layers to each other by magnetic interaction with an appropriate magnitude to impart an appropriate initial angle to the layer of the in-plane magnetization film, and suppressing variations in reversal time of spin torque reversal (see Patent Literatures 1 and 2).

CITATION LIST

Patent Literature

Patent Literature 1: Japanese Patent Application Laid-open No. 2012-008538
Patent Literature 2: Japanese Patent Application Laid-open No. 2013-115299

Non-Patent Literature

Non-Patent Literature 1: Physical Review B, vol. 54, p. 9353 (1996)
Non-Patent Literature 2: Journal of Magnetism and Magnetic Materials, vol. 159, p. L1 (1996)

DISCLOSURE OF INVENTION

Technical Problem

However, since the storage devices described in Patent Literatures 1 and 2 use magnetic interaction between two magnetic body layers, the influence of this interaction increases depending on the device size. This has made it difficult to stably hold the initial angle of magnetization.

In view of the circumstances as described above, it is an object of the present technology to provide a storage device, a manufacturing method therefor, and a storage apparatus that are capable of effectively suppressing variations in reversal time of spin torque reversal and stably performing high-speed operation.

Solution to Problem

In order to achieve the object described above, a storage device according to one embodiment of the present technology includes a magnetization fixed layer, an intermediate layer, and a storage layer.

The magnetization fixed layer is configured to have magnetization in an orientation perpendicular to a film surface and a constant magnetization direction.

The intermediate layer includes a non-magnetic body and is disposed on the magnetization fixed layer.

The storage layer includes an outer circumferential portion and a center portion, is disposed to face the magnetization fixed layer with the intermediate layer sandwiched therebetween, and is configured to have a variable magnetization direction, the outer circumferential portion having magnetization in an orientation perpendicular to a film surface, the center portion being formed by being surrounded by the outer circumferential portion and having magnetization inclined from the orientation perpendicular to the film surface.

According to the configuration described above, since the magnetization of the center portion is inclined from the orientation perpendicular to the film surface, the magnetization can be reversed at high speed. Further, since magnetic interaction between two layers is not used, the inclination of the magnetization of the center portion can be stably maintained without influence of the interaction. Furthermore, the outer circumferential portion having the magnetization in the orientation perpendicular to the film surface can prevent a magnetic influence of another magnetic body layer from reaching the center portion. This can also stably maintain the inclination of the magnetization of the center portion.

Further, the storage device may further include an oxide layer that is disposed on the storage layer on the opposite side to the intermediate layer and is capable of making perpendicular magnetic anisotropy of the outer circumferential portion higher than perpendicular magnetic anisotropy of the center portion on the basis of crystallinity of an interface with the storage layer, the oxide layer including a first region and a second region, the first region being disposed on the outer circumferential portion and having favorable crystallinity, the second region being disposed on the center portion and having degraded crystallinity relative to that of the first region or being configured as a space.

Accordingly, the outer circumferential portion can have a configuration having a crystalline structure stabilized by coming into contact with the first region having favorable crystallinity, capable of enhancing the perpendicular magnetic anisotropy, and having the magnetization in the orientation perpendicular to the film surface. Meanwhile, since the center portion faces the second region that has degraded crystallinity or is configured as a space, the crystalline structure of the center portion is less stable than that of the outer circumferential portion, and the perpendicular magnetic anisotropy cannot be enhanced. Therefore, the center portion can have a configuration having the magnetization inclined from the orientation perpendicular to the film surface, with an additional effect of a demagnetizing field applied from the outer circumferential portion.

Specifically, the second region of the oxide layer may have degraded crystallinity relative to that of the first region.

Further, in this case, the second region may be formed to be thinner than the first region.

Alternatively, in the oxide layer, the second region of the oxide layer may be configured as a space.

Further, the outer circumferential portion may have a first thickness, and the center portion may have a second thickness that is thicker than the first thickness.

Accordingly, the center portion is less affected by the crystallinity of an interface with the intermediate portion than the outer circumferential portion, and the crystalline structure is easy to disturb. This can weaken the perpendicular magnetic anisotropy of the center portion and enhance the perpendicular magnetic anisotropy of the outer circumferential portion.

Further, the outer circumferential portion may contain a light element at a first composition ratio, and the center portion may contain the light element at a second composition ratio that is different from the first composition ratio.

Accordingly, it is possible to change the crystalline structures of the outer circumferential portion and the central portion and make the perpendicular magnetic anisotropy of the outer circumferential portion higher than that of the center portion.

More specifically, the light element may contain at least one of B and C, and the second composition ratio may be smaller than the first composition ratio by 5% or more.

Alternatively, the light element may contain at least one of O and N, and the second composition ratio may be larger than the first composition ratio by 2% or more.

Further, the storage layer may have a horny ratio of 0.7 or more and less than 1.

Accordingly, it is possible to provide a storage layer having an obliquely-inclined magnetized state.

A manufacturing method for a storage device according to another embodiment of the present technology includes: forming a magnetization fixed layer that has magnetization in an orientation perpendicular to a film surface and a constant magnetization direction; forming an intermediate layer that includes a non-magnetic body on the magnetization fixed layer; forming a magnetic body layer having a variable magnetization direction on the intermediate layer; and forming a storage layer by forming an outer circumferential portion and a center portion in the magnetic body layer, the outer circumferential portion having magnetization in an orientation perpendicular to a film surface, the center portion being formed by being surrounded by the outer circumferential portion and having magnetization inclined from the orientation perpendicular to the film surface.

Accordingly, it is possible to manufacture a storage device capable of reversing magnetization at high speed and also stably maintaining inclination of magnetization of a center portion.

The step of forming a storage layer may include forming a non-oxide layer on the magnetic body layer, and performing oxidation treatment on the non-oxide layer to form an oxide layer, the oxide layer including a first region and a second region, the first region being disposed on the outer circumferential portion and having favorable crystallinity, the second region being disposed on the center portion and having degraded crystallinity relative to that of the first region, the oxide layer being disposed on the storage layer on the opposite side to the intermediate layer and being capable of making perpendicular magnetic anisotropy of the outer circumferential portion higher than perpendicular magnetic anisotropy of the center portion on the basis of crystallinity of an interface with the storage layer.

Accordingly, it is possible to form a storage layer including an outer circumferential portion and a center portion, the outer circumferential portion having a crystalline structure stabilized by coming into contact with the first region having favorable crystallinity and having high perpendicular magnetic anisotropy, the center portion having a less stable crystalline structure and lower perpendicular magnetic anisotropy than the outer circumferential portion.

Alternatively, the step of forming a storage layer may include forming an oxide layer on the magnetic body layer, forming a mask pattern on an upper portion of the oxide layer, and etching the center of the oxide layer via the mask pattern under a predetermined etching condition.

Accordingly, it is possible to form an oxide layer including a first region and a second region thinner than the first region. Furthermore, it is also possible to form an oxide layer including a second region configured as a space by completely removing the center of the oxide layer.

In this case, the step of forming a mask pattern may include forming a first mask pattern including a first mask portion and a second mask portion, the first mask portion being formed on an upper portion of the outer circumferential portion, the second mask portion being formed on an upper portion of the center portion and being thinner than the first mask portion, and the step of etching may include removing the second mask portion and removing at least a part of the oxide layer via the first mask portion.

Accordingly, using a difference in thickness distribution of the first mask pattern, the oxide layer having the configuration described above can be efficiently formed.

Furthermore, more specifically, the step of forming a mask pattern may include forming a second mask pattern on at least the second mask portion of the first mask pattern under the predetermined condition, the second mask pattern having a higher etching rate than the first mask pattern, and the step of etching may include removing the second mask portion and the second mask pattern on the second mask portion and removing a part of the oxide layer via the first mask portion.

Accordingly, using the second mask pattern, the first mask pattern having a different thickness distribution can be easily formed. Further, since the etching rate of the second mask pattern is higher than that of the first mask pattern, the second mask portion and the second mask pattern can be easily removed, and the oxide layer can be formed.

The step of forming a storage layer may include forming a mask pattern on an upper portion of the center portion, and etching a part of the outer circumferential portion via the mask pattern.

Accordingly, it is possible to form a storage layer including an outer circumferential portion having a first thickness and a center portion having a second thickness thicker than the first thickness.

In this case, a protective layer may be further formed on the magnetic body layer after forming the magnetic body layer. The step of forming a mask pattern on an upper portion of the center portion may include forming the mask pattern on the protective layer, and the step of etching a part of the outer circumferential portion via the mask pattern may include etching, after forming the mask pattern, at least a part of the protective layer via the mask pattern under a first etching condition, selectively etching the mask pattern to reduce the mask pattern, and etching a part of the outer circumferential portion via the reduced mask pattern under a second etching condition.

Accordingly, in the magnetic body layer, a region disposed below the thin part of the protective layer is removed. Further, a region disposed below the thick part of the protective layer and exposed from the reduced mask pattern can be partially removed. Furthermore, a region below the reduced mask pattern is left together with a part of the protective layer.

Therefore, planar shapes of the storage layer and the protective layer can be made smaller than those of the intermediate layer and the magnetic fixed layer, and the outer circumferential portion can be partially etched, so that the storage layer described above can be formed.

Further, the step of forming a storage layer may include supplying or removing a light element from an outer circumferential surface of the magnetic body layer.

Accordingly, it is possible to form a storage layer having different composition ratios of the light element between the outer circumferential portion and the center portion.

In this case, the step of supplying a light element from an outer circumferential surface of the magnetic body layer may include forming a light element supply layer that covers the outer circumferential surface of the magnetic body layer, and supplying the light element from the light element supply layer to the magnetic body layer.

A storage apparatus according to still another embodiment of the present technology includes a storage device, a wiring unit, and a current supply control unit.

The storage device includes a magnetization fixed layer, an intermediate layer, and a storage layer.

The magnetization fixed layer is configured to have magnetization in an orientation perpendicular to a film surface and a constant magnetization direction.

The intermediate layer includes a non-magnetic body and is disposed on the magnetization fixed layer.

The storage layer includes an outer circumferential portion and a center portion, is disposed to face the magnetization fixed layer with the intermediate layer sandwiched therebetween, and is configured to have a variable magnetization direction, the outer circumferential portion having magnetization in an orientation perpendicular to a film surface, the center portion being formed by being surrounded by the outer circumferential portion and having magnetization inclined from the orientation perpendicular to the film surface.

The wiring unit is configured to be capable of supplying a current flowing in a lamination direction to the storage device.

The current supply control unit is configured to be capable of controlling supply of a current to the storage device via the wiring unit.

Advantageous Effects of Invention

As described above, according to the present technology, it is possible to provide a storage device, a manufacturing method therefor, and a storage apparatus that are capable of effectively suppressing variations in reversal time of spin torque reversal and stably performing high-speed operation.

It should be noted that effects described herein are not necessarily limited and any of the effects described in the present disclosure may be produced.

BRIEF DESCRIPTION OF DRAWINGS

FIG. 3 is a cross-sectional diagram showing a schematic configuration of a storage device included in the storage apparatus.

FIGS. 4A and 4B are schematic diagrams each showing a magnetized state of a storage layer of the storage device; FIG. 4A is a cross-sectional diagram, and FIG. 4B is a perspective diagram.

FIG. 5 is a cross-sectional diagram of a main part of the storage device.

FIGS. 7A and 7B are schematic diagrams showing a configuration of a storage device according to a comparative example of the first embodiment; FIG. 7A is a cross-sectional diagram, and FIG. 7B is a perspective diagram.

FIG. 8 is a schematic cross-sectional diagram for more specifically describing a magnetized state of the storage device according to the comparative example.

FIGS. 11A, 11B, 11C, and 11D are schematic cross-sectional diagrams for describing a manufacturing method for the storage device.

FIGS. 16A, 16B, 16C, 16D, and 16E are schematic cross-sectional diagrams for describing a manufacturing method for the storage device.

FIG. 20A is a partially cut-away perspective view showing an internal structure, and FIG. 20B is a cross-sectional view.

FIGS. 21A and 21B are schematic diagrams showing configurations of samples according to Example 1 and Comparative Example 1; FIG. 21A shows a configuration of a laminate produced in the manufacturing process of a storage device of Example 1, and FIG. 21B shows a configuration of a storage device according to Comparative Example 1.

FIG. 22 is a graph showing the dependence of a coercive force and a horny ratio on an oxidation treatment time in oxidation treatment of the process of producing the storage device according to Example 1.

MODE(S) FOR CARRYING OUT THE INVENTION

Hereinafter, embodiments according to the present technology will be described with reference to the drawings.

First Embodiment

[Configuration of Storage Apparatus]

Figure 1:
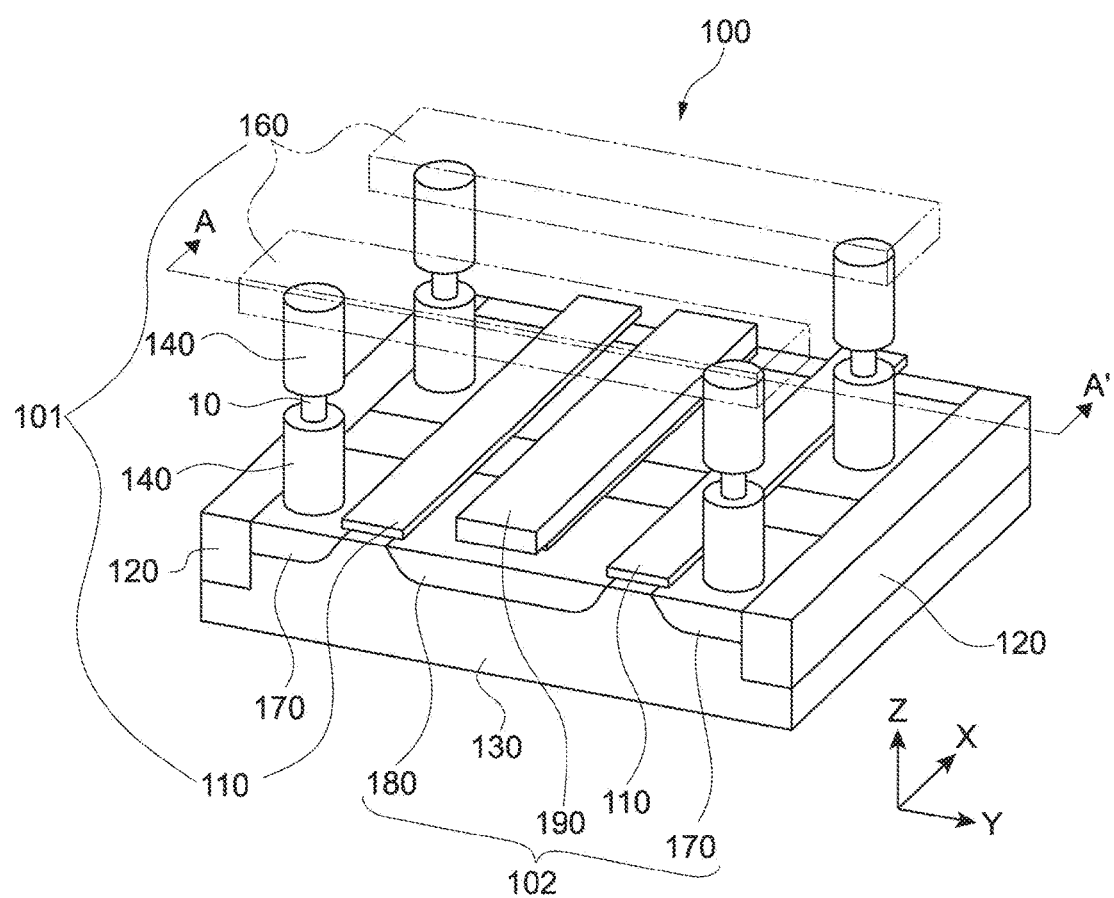
FIG. 1 is a perspective view showing a schematic configuration of a storage apparatus according to a first embodiment of the present technology.
Figure 2:
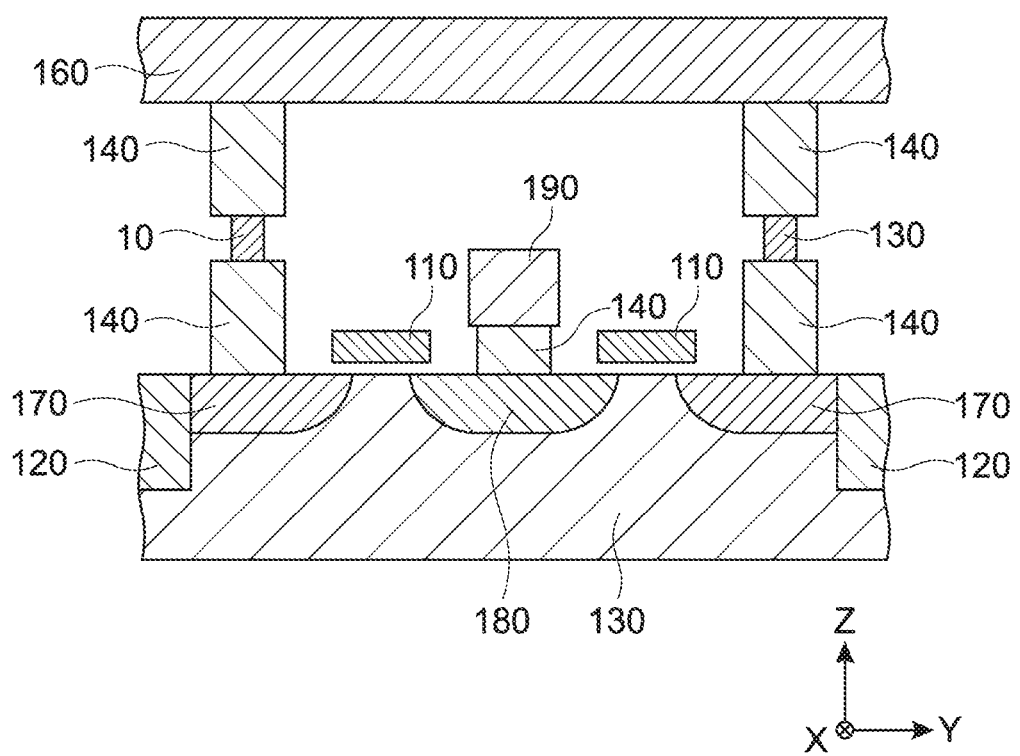
FIG. 2 is a cross-sectional view seen from the A-A' direction of FIG. 1.

FIG. 1 and FIG. 2 are views each showing a schematic configuration of a storage apparatus according to this embodiment. FIG. 1 is a perspective view, and FIG. 2 is a cross-sectional view seen from the A-A' direction of FIG. 1. It should be noted that in the figures an X-axis direction, a Y-axis direction, and a Z-axis direction represent three axis directions orthogonal to one another, the X-axis direction and the Y-axis direction represent an in-plane direction in each film of a storage device, and the Z-axis direction represents a lamination direction (that is, a direction perpendicular to the film surface) of the storage device.

As shown in those figures, a storage apparatus 100 includes a plurality of storage devices 10, a wiring unit 101, and a current supply control unit 102.

Each of the storage devices 10 is constituted of an ST-MRAM (Spin Torque-Magnetic Random Access Memory) that can hold information in a magnetized state as will be described later. Each of the storage devices 10 is disposed between two columnar contact layers 140 extending in the Z-axis direction.

The wiring unit 101 is configured to be capable of supplying a current flowing in the Z-axis direction (the lamination direction) to the storage devices 10.

Specifically, the wiring unit 101 includes a plurality of first address wires 110 configured as word lines and a plurality of second address wires 160 configured as bit lines.

Each of the first address wires 110 extends along the X-axis direction, for example. Each of the first address wires 110 is connected to the storage device 10 via a source region 170 and the contact layers 140. The source region 170 will be described later.

Each of the second address wires 120 extends orthogonally to each of the first address wires 110 and extends along the Y-axis direction, for example. Further, each of the second address wires 120 is disposed to face the first address wires 110 in the Z-axis direction. Further, each of the second address wires 160 is connected to the storage device 10 via the contact layer 140.

The current supply control unit 102 is configured to be capable of controlling supply of a current to the storage device 10 via the wiring unit 101, specifically, configures a selection transistor for selecting each of the storage devices 10.

Specifically, the current supply control unit 102 includes a drain region 180, the source region 170, and a gate electrode 110. Each configuration in the current supply control unit 102 is formed in a part isolated by device isolation layers 120 of a semiconductor substrate 130 such as a silicon substrate.

In FIG. 1, the drain region 180 is formed commonly to two selection transistors disposed along the X-axis direction. A wire 190 for supplying a current to the current supply control unit 102 is connected to the drain region 180.

The gate electrode 110 also serves as the first address wire 110 and is connected to the drain region 180 and the source region 170.

The source region 170 is connected to the storage device 10 via the contact layer 140.

The storage apparatus 100 having the configuration described above can supply a current in the Z-axis direction to a predetermined storage device 10 via the first and second address wires 110 and 160 selected by the current supply control unit 102.

Subsequently, the schematic configuration and the principle of operation of the storage device 10 will be described.

[Schematic Configuration of Storage Device]

FIG. 3 is a cross-sectional diagram showing a schematic configuration of the storage device 10.

As shown in the figure, the storage device 10 includes a base layer 17, a magnetic coupling layer 16, a coupling layer 15, a magnetization fixed layer 14, an intermediate layer 13, a storage layer 12, and a protective layer 11. The storage device 10 is formed by laminating those layers in the Z-axis direction and is configured into a tube that extends in the Z-axis direction as a whole, for example. By supply of a current in the Z-axis direction from the wiring unit 101, the storage device 10 causes the orientation of magnetization of the storage layer 12 of the storage device 1 to be reversed by spin torque magnetization reversal, to enable information recording.

It should be noted that the white arrows in the figure schematically show respective directions of magnetization in the magnetic coupling layer 16, the magnetic fixed layer 14, and the storage layer 12 that are magnetic body films. As indicated by the arrows, the magnetic coupling layer 16, the magnetic fixed layer 14, and the storage layer 12 of the storage device 10 can be configured as perpendicular magnetization films.

The base layer 17 and the protective layer 11 are used for the electrodes or the like and are made of an electrically conductive material such as Ru or Ta. It should be noted that those layers may be constituted of a laminated film made of electrically conductive materials different from each other.

The magnetic coupling layer 16 has a function of counteracting a leakage magnetic field from the magnetization fixed layer 14 and the magnetic coupling layer 16 by magnetical coupling to the magnetization fixed layer 14. Accordingly, a magnetic influence on the storage layer 12 can be made small. The magnetic coupling layer 16 includes a magnetic body, for which a magnetic body having a high holding force to some extend can be used. As such a magnetic body, for example, an amorphous perpendicular magnetization film of TbFeCo, GdFeCo, or the like, a magnetic film of CoPt, FePt, or the like having crystal magnetic anisotropy, a laminated film of Co/Pt or Co/Pd, or a film using interface anisotropy that works between an oxide and a magnetic body can be applied.

The coupling layer 15 causes the magnetic fixed layer 14 and the magnetic coupling layer 16 to be highly magnetically coupled to each other such that, for example, magnetization of both the layers are antiparallel. The coupling layer 15 can apply a non-magnetic metal material such as Cr, Cu, Ru, Re, or Os.

The magnetization fixed layer 14 is a layer that can be a reference of information. The magnetization fixed layer 14 is configured to have magnetization in an orientation perpendicular to the film surface and a constant magnetization direction. The magnetization fixed layer 14 includes a magnetic body as is the case with the magnetic coupling layer 16. As such a magnetic body, for example, an amorphous perpendicular magnetization film of TbFeCo, GdFeCo, or the like, a magnetic film of CoPt, FePt, or the like having crystal magnetic anisotropy, a laminated film of Co/Pt or Co/Pd, or a film using interface anisotropy that works between an oxide and a magnetic body can be applied.

The intermediate layer 13 functions as a tunnel barrier layer, in which tunnel resistance is changed by the orientations of magnetization of the storage layer 12 and the magnetization fixed layer 14, thus enabling read-out of information. The intermediate layer 13 includes a non-magnetic body and is disposed on the magnetization fixed layer 14. As the non-magnetic body, a material having a magnetoresistive change ratio (MR ratio) increased in order to read out a magnetized state is desirably used. Specifically, the material may be metal or an insulator. However, using an insulator makes it possible to obtain a higher read-out signal (a rate of change in resistance) and perform recording with a lower current. As such a material, for example, an oxide such as MgO or $Al_2O_3$ can be applied.

It should be noted that in a case where an insulator is used as the intermediate layer 13, the device at that time is referred to as a ferromagnetic tunnel junction (Magnetic Tunnel Junction: MTJ) device.

The storage layer 12 is disposed to face the magnetization fixed layer 14 with the intermediate layer 13 sandwiched therebetween and is configured to have a variable magnetization direction. The storage layer 12 holds information by a magnetized state (orientation of magnetization) of the magnetic body, and is constituted of a magnetic body including a ferromagnetic layer. As the magnetic body, for example, an amorphous perpendicular magnetization film of TbFeCo, GdFeCo, or the like, a magnetic film of CoPt, FePt, or the like having crystal magnetic anisotropy, or a film using interface anisotropy that works between an oxide and a magnetic body can be applied.

Further, the storage layer 12 can be a laminated film made of different materials, for example, a laminated film of a magnetic film, Ta, and the like, a laminated film of Co/Pt or Co/Pd, and the like.

Furthermore, in this embodiment, the storage layer 12 includes an outer circumferential portion and a center portion (not shown in FIG. 3) and is configured to enable high-speed magnetization reversal. Details of the storage layer 12 will be described later.

[Principle of Operation of Storage Device]

The storage device 10 of this embodiment is a so-called ST-MRAM that uses the fact that a spin polarized electron that passes through the magnetization fixed layer 14 having a constant magnetization direction gives torque (spin injection torque) to the storage layer 12 when entering the storage layer 12 via the intermediate layer 13. In other words, feeding a current of a certain threshold value or more in the perpendicular direction (the lamination direction, the Z-axis direction) of the storage device 10 allows the magnetization of the storage layer 12 to be reversed.

Binary information of 0 and 1 (hereinafter, referred to as 0/1) is expressed by a magnetized state of the storage layer 12, and rewriting (recording) of 0/1 is performed by changing the polarity of the current.

It should be noted that in the following description the magnetic fixed layer 14, the intermediate layer 13, and the storage layer 12 are configured as an MTJ device.

(1. Regarding Recording to Storage Device)

First, considered is a case where an electron is moved from the magnetization fixed layer 14 to the storage layer 12 when orientations of magnetic moments in the magnetization fixed layer 14 and the storage layer 12 are in the opposite directions.

The magnetization fixed layer 14 is a fixed magnetic layer in which the orientation of the magnetic moment is fixed because of a high coercive force, as described above.

Here, an electron has two kinds of angular momentums of spin. Suppose that those are defined as upward orientation and downward orientation. Inside a non-magnetic body, both of them are equal in number, while inside a ferromagnetic body, both of them are different in number.

In an electron that has passed through the magnetization fixed layer 14, there occurs a difference in number between the upward orientation and the downward orientation, thus causing spin polarization. In a case where the intermediate layer 13 as a non-magnetic layer is configured to have a sufficiently small thickness, the electron reaches the storage layer 12 as another magnetic body, before spin polarization due to the electron having passed through the magnetization fixed layer 14 is released to generate a non-polarized state (in which the upward orientation and the downward orientation are equal in number) in an ordinary non-magnetic body.

In the storage layer 12, the sign of spin polarization is opposite to that of the magnetization fixed layer 14. This causes some electrons to be reversed in order to reduce energy of a system, that is, causes the orientations of the angular momentums of spin to be changed. At that time, since the whole angular momentum of the system has to be kept, reaction that is equivalent to a sum of the change in angular momentums by the electrons whose orientations are made to change is also given to the magnetic moment of the storage layer 12.

In a case where the number of electrons (current) that pass through in unit time is small, the total number of the electrons whose orientations are made to change is also small. Therefore, the change in the angular momentum generated in the magnetic moment of the storage layer 12 is also small. However, an increase in current makes it possible to give a larger change in angular momentum in unit time.

A temporal change in the angular momentum is torque. In other words, when torque exceeds a certain threshold value, the magnetic moment of the storage layer 12 starts a precession movement and becomes stable where rotated by 180 degrees because of its uniaxial anisotropy. In other words, the magnetic moment of the storage layer 12 is reversed from an opposite direction state to a same direction state with respect to the magnetic moment of the magnetization fixed layer 14.

It should be noted that in the following description the "same direction" and the "opposite direction" refer to the directions of magnetization of the storage layer 12 with the direction of magnetization of the magnetization fixed layer 14 as a reference, and are also referred to as "parallel" and "antiparallel", respectively.

Next, considered is a case where an electron is moved from the storage layer 12 to the magnetization fixed layer 14 when the orientations of the magnetic moments are the same in the magnetization fixed layer 14 and the storage layer 12.

Electrons that are about to enter the magnetization fixed layer 14 are reflected on the magnetization fixed layer 14. Electrons that have been spin-reversed then give torque to the magnetic moment of the storage layer 12 when entering the storage layer 12, thus enabling the magnetic moment to be reversed to the opposite direction state. However, at this occasion, the amount of current that causes the reversal becomes larger than that in a case of the reversal from the opposite direction state to the same direction state.

It may be difficult to intuitively understand the reversal of the magnetic moment from the same direction state to the opposite direction state. However, one possible interpretation may be as follows: since the magnetization fixed layer 14 is fixed, the magnetic moment is not allowed to be reversed; instead the storage layer 12 is reversed in order to keep the angular momentum of the whole system.

As described above, 0/1 recording may be performed by feeding currents corresponding to the respective polarities and having a certain threshold value or more in a direction from the magnetization fixed layer 14 to the storage layer 12 or in the opposite direction.

(2. Regarding Read-Out of Information from Storage Device)

Meanwhile, read-out of information is performed, similarly to a general MRAM, using a magnetoresistive effect.

In other words, a current is fed in a perpendicular direction (lamination direction), similarly to the case of recording as described above, and the following phenomenon is then used: electric resistance exhibited by the device varies in accordance with whether the magnetic moment of the storage layer 12 is in the same direction or in the opposite direction with respect to the magnetic moment of the magnetization fixed layer 14.

(3. Regarding Threshold Value of Reverse Current)

Subsequently, a threshold value $Ic_0$ of a reverse current, which is necessary when the orientation of magnetization of the storage layer 12 is reversed by spin torque magnetization reversal, will be examined.

It should be noted that the threshold value $Ic_0$ of the reverse current differs depending on whether axes of easy magnetization of the magnetic fixed layer 14 and the storage layer 12 are in a perpendicular direction. Hereinafter, a case where the axis of easy magnetization is in the perpendicular direction will be described.

Assuming that the reverse current of the device is Ic, in a case of a reversal from the same direction to the opposite direction, the following expression is obtained.

$$Ic_0 = (A \cdot \alpha \cdot Ms \cdot V/g(0)/P) \cdot Hk$$

In a case of a reversal from the opposite direction to the same direction, the following expression is obtained.

$$Ic_0 = -(A \cdot \alpha \cdot Ms \cdot V/g(\pi)/P) \cdot Hk$$

In the expressions described above, A represents a constant, $\alpha$ represents a damping constant, Ms represents saturated magnetization, V represents a volume of the device, P represents a spin polarization rate, $g(0)$ and $g(\pi)$ represent coefficients corresponding to efficiencies of transferring spin torque to the other-side magnetic layer in the cases of the same direction and the opposite direction, respectively, and Hk represents apparent perpendicular magnetic anisotropy including a demagnetizing field.

Here, the reverse current $Ic_0$ is expressed by the following (Expression 1) in relation to an index of thermal stability $\Delta$.

[Expression 1]

$$I_{C0} = \left(\frac{4ek_BT}{\hbar}\right)\left(\frac{\alpha\Delta}{\eta}\right) \quad \text{(Expression 1)}$$

where e represents electrical charge of an electron, $\eta$ represents spin injection efficiency, the barred h represents a reduced Planck constant, $\alpha$ represents a damping constant, $k_B$ represents a Boltzmann constant, and T represents a temperature.

A specific example of the threshold value of the current that causes the magnetized state of the storage layer 12 to be changed is, for example, approximately a hundred to several hundreds µA in a device in which the storage layer 12 has a thickness of 2 nm and a circular planar pattern with a diameter of 100 nm.

In contrast to this, in an MRAM in which magnetization reversal is performed by a current magnetic field, a write current of several mA or more is necessary.

Therefore, it is found that in the case of the ST-MRAM the threshold value of the write current is made sufficiently small as described above, which is effective for reduction in power consumption of an integrated circuit.

Further, wiring for generating a current magnetic field is eliminated, which is necessary in an ordinary MRAM. This is also advantageous in view of integration degree as compared with an ordinary MRAM.

It should be noted that the storage device 10 configured as a part of the storage apparatus 100 is connected to the selection transistor (the current supply control unit 102) as described above. Accordingly, a current that flows in the storage device 10 is limited by a magnitude of a current that can be fed through the selection transistor (a saturation current of the selection transistor). Accordingly, it is necessary to improve spin injection efficiency and reduce a current fed to the storage device 10.

(4. Regarding Recording Characteristics of Storage Device)

Subsequently, recording characteristics of the storage device 10 of this embodiment will be examined.

In order that the storage device 10 can exist as a non-volatile memory, the storage device 10 has to hold information written in the storage layer 12.

As an index of capability of holding information, a value of the index of thermal stability $\Delta$ ($=KV/k_BT$) with respect to thermal fluctuation of the storage layer 12 is used for determination. This $\Delta$ is expressed by (Expression 2).

[Expression 2]

$$\Delta = KV/k_BT = M_s \cdot V \cdot H_k \cdot (1/2k_BT) \quad \text{(Expression 2)}$$

where Hk represents an effective anisotropic magnetic field, $k_B$ represents a Boltzmann constant, T represents a temperature, Ms represents saturated magnetization quantity, V represents a volume of the storage layer 12, and K represents anisotropic energy.

Incorporated in the effective anisotropic magnetic field Hk are influences of shape magnetic anisotropy, induction magnetic anisotropy, crystal magnetic anisotropy, and the like. On an assumption of a simultaneous rotation model of a single magnetic domain, this is equivalent to a coercive force.

There may be a trade-off relationship between the index of thermal stability $\Delta$ and the current threshold value $Ic_0$. Therefore, in order to maintain recording characteristics, compatibility between both of them becomes an issue in many cases. In other words, in order to reduce the reverse current, a smaller index of thermal stability $\Delta$ is desirable, but in order to maintain sufficient non-volatility, a larger index of thermal stability $\Delta$ is desirable.

Therefore, in order that the storage device 10 can function as a memory, it is necessary to reduce a current, which is necessary in magnetization reversal by spin injection, to the amount of a saturation current of the transistor or less, and to ensure thermal stability to hold written information.

(5. Regarding Dependence of Recording Characteristics of Storage Device on Recording Pulse Width)

The reverse current described above is a theoretical reverse current, and an actual reverse current varies depending on a recording pulse width.

When the recording pulse width is sufficiently long, the reverse current is expressed by (Expression 3).

[Expression 3]

$$<Ic> = Ic_0[1 - \ln(t/t_0)/\Delta] \quad \text{(Expression 3)}$$

Here, $Ic_0$ represents a threshold value of the reverse current described above, $<Ic>$ represents an average of the reverse current, t represents an application time of the pulse, to represents a reference time of 1 ns, and $\Delta$ represents the index of thermal stability described above.

According to this expression, as the pulse width is longer, an average reverse current is smaller, and as the pulse width is shorter, the reverse current increases and is proportional to a logarithm of the pulse width.

However, the relationship described above is established in a region where thermal fluctuation is dominant over reversal (thermal fluctuation region) and in a case where the pulse width has several tens ns or more.

Meanwhile, when the pulse width is shorter than several tens ns, the reverse current depends on an initial angle of magnetization, and a relationship as expressed by Expression 4 is obtained.

[Expression 4]

$$\frac{\eta(I_c - I_{c0})t}{e} = \left(\frac{M_sV}{\mu_B}\right)\ln\left(\frac{\pi}{2\theta}\right) \quad \text{(Expression 4)}$$

Here, $\theta$ represents an initial angle of magnetization, n represents a ratio of the circumference of a circle to its diameter, and the others are the same symbols as those used above. The initial angle has dependence on $\Delta$, the average of the reverse current is as shown in Expression 5.

[Expression 5]

$$\langle I_c \rangle = I_{C0} + \frac{M_sV}{\mu_B}\frac{e}{\eta t}\left[\ln\left(\frac{\pi\sqrt{\Delta}}{2}\right) + \frac{\gamma}{2}\right] \quad \text{(Expression 5)}$$

Here, $\gamma$ represents Euler's constant, and the reverse current increases in reverse proportion to the pulse width. This region is referred to as a precession movement region.

Further, in this region, the increase in the reverse current Ic is not dependent on $Ic_0$. As a result, it is impossible to suppress the increase in the current by reduction in damping constant $\alpha$, and it is difficult to reduce the reverse current by a short pulse of 10 ns or less.

Further, variations of the initial angle of magnetization are reflected in variations of the reverse current. Accordingly, in a case where there are variations of the initial angle of magnetization, in order to reliably cause reversal without errors, a current larger than the reverse current described above becomes necessary.

In this regard, in order to solve this problem, the storage layer 12 of the storage device 10 according to this embodiment is configured to be capable of maintaining the initial angle of magnetization, which is left up to thermal fluctuation, in a state inclined to some extent.

Hereinafter, a detailed configuration of the storage device 10 with a focus on the storage layer 12 will be described.

[Detailed Configuration of Storage Device]

FIGS. 4A and 4B are schematic diagrams each showing a magnetized state of the storage layer 12 of the storage device 10 of this embodiment. FIG. 4A is a cross-sectional diagram, and FIG. 4B is a perspective diagram.

As shown in the figures, the storage layer 12 includes an outer circumferential portion 121 and a center portion 122.

The outer circumferential portion 121 faces the outside of the storage layer 12 and has magnetization in an orientation perpendicular to a film surface. In other words, the outer circumferential portion 121 has an axis of easy magnetization in the Z-axis direction and has high perpendicular magnetic anisotropy. It should be noted that the "orientation perpendicular to a film surface" used herein refers to an orientation that is perpendicular to the film surface or very slightly inclined from a direction perpendicular to the film surface (for example, approximately 5°) and can be considered to be substantially perpendicular.

The center portion 122 is formed by being surrounded by the outer circumferential portion 121 and has magnetization inclined from the orientation perpendicular to the film surface. In other words, the center portion 122 has lower perpendicular magnetic anisotropy than the outer circumferential portion 121 and forms magnetization obliquely inclined from the Z-axis direction because of the influence of a demagnetizing field from the outer circumferential portion 121, or the like.

FIG. 5 is a cross-sectional diagram of a main part of the storage device 10. It should be noted that in FIG. 5 the base layer 17, the magnetic coupling layer 16, the coupling layer 15, and the magnetization fixed layer 14 that are shown in FIG. 3 are omitted.

As shown in the figure, the storage device 10 further includes an oxide layer 18 in this embodiment, in addition to the configuration described with reference to FIG. 3.

The oxide layer 18 is disposed on the storage layer 12 on the opposite side to the intermediate layer 13 and is configured to be capable of making the perpendicular magnetic anisotropy of the outer circumferential portion 121 higher than the perpendicular magnetic anisotropy of the center portion 122 on the basis of crystallinity of an interface with the storage layer 12. As a material of the oxide layer 18, MgO as an oxide of Mg, $Al_2O_3$ as an oxide of Al, or the like can be applied.

The oxide layer 18 includes a first region 181 disposed on the outer circumferential portion 121 and a second region 182 disposed on the center portion 122.

In this embodiment, the first region 181 has more favorable crystallinity than the second region 182. In other words, the second region 182 has degraded crystallinity. Accordingly, the crystallinity of the outer circumferential portion 121 being in contact with the first region 181 can be made more favorable than the crystallinity of the center portion 122 being in contact with the second region 182. Accordingly, it is possible to cause spontaneous magnetization of the outer circumferential portion 121 to be easily oriented in the Z-axis direction and consequently make the perpendicular magnetic anisotropy of the outer circumferential portion 121 higher than the perpendicular magnetic anisotropy of the center portion 122 in the oxide layer 18.

It should be noted that the "favorable crystallinity" used herein refers to having a monocrystalline structure or a polycrystalline structure, and the "degraded crystallinity" used herein refers to having an amorphous structure because a monocrystalline structure or a polycrystalline structure is disturbed.

In this embodiment, the first region 181 is constituted of MgO having a stoichiometric composition and being sufficiently oxidized, and the second region 182 is constituted of MgO containing a small amount of 0 in terms of a stoichiometric composition or constituted of non-oxidized Mg. This enables the first region 181 to have, for example, a cubic crystalline structure and the second region 182 to have the disturbed crystalline structure.

[Manufacturing Method for Storage Device]

Figure 6A:
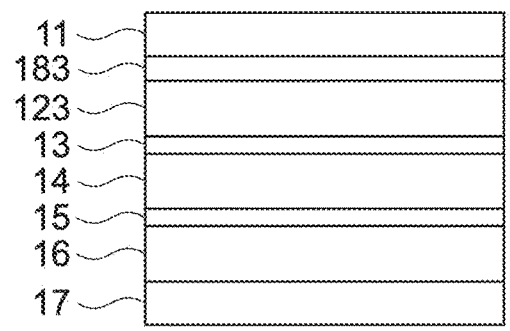
FIGS. 6A, 6B, and 6C are schematic cross-sectional diagrams for describing a manufacturing method for the storage device.
Figure 6B:
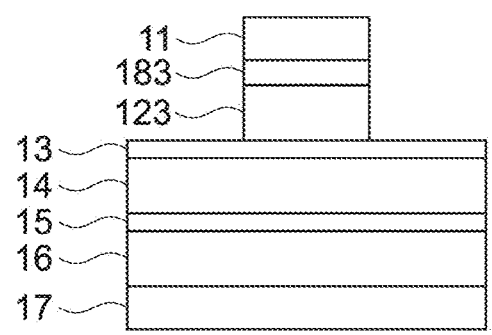
Figure 6C:
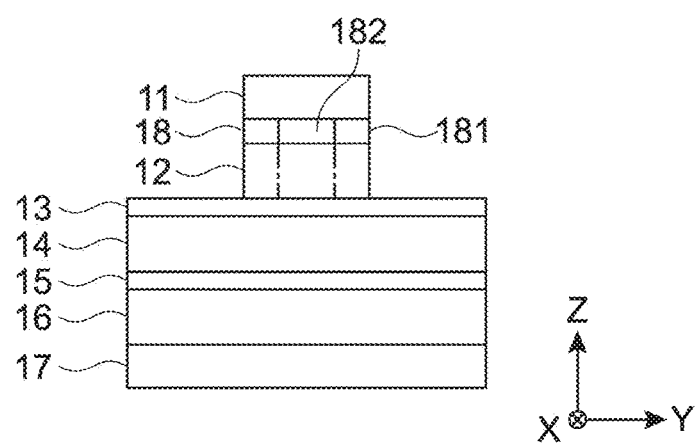

FIGS. 6A, 6B, and 6C are schematic cross-sectional diagrams for describing a manufacturing method for the storage device 10 of this embodiment. The manufacturing method according to this embodiment includes: forming a magnetization fixed layer 14 that has magnetization in an orientation perpendicular to a film surface and a constant magnetization direction; forming an intermediate layer 13 that includes a non-magnetic body on the magnetization fixed layer 14; forming a magnetic body layer 123 having a variable magnetization direction on the intermediate layer 13; and forming a storage layer 12 by forming an outer circumferential portion 121 and a center portion 122 in the magnetic body layer 123, the outer circumferential portion 121 having magnetization in an orientation perpendicular to a film surface, the center portion 122 being formed by being surrounded by the outer circumferential portion 121 and having magnetization inclined from the orientation perpendicular to the film surface.

Furthermore, in this embodiment, the step of forming the storage layer 12 may include forming a non-oxide layer 183 on the magnetic body layer 123, and performing oxidation treatment on the non-oxide layer 183 to form an oxide layer 18, the oxide layer 18 including a first region 181 and a second region 182, the first region 181 being disposed on the outer circumferential portion 121 and having favorable crystallinity, the second region 182 being disposed on the center portion 122 and having degraded crystallinity relative to that of the first region 182, the oxide layer 18 being disposed on the storage layer 12 on the opposite side to the intermediate layer 13 and being capable of making perpendicular magnetic anisotropy of the outer circumferential portion 121 higher than perpendicular magnetic anisotropy of the center portion 122 on the basis of crystallinity of an interface with the storage layer 12.

Hereinafter, description will be more specifically given with reference to FIGS. 6A, 6B, and 6C.

First, as shown in FIG. 6A, the base layer 17, the magnetic coupling layer 16, the coupling layer 15, the magnetization fixed layer 14, the intermediate layer 13, the magnetic body layer 123, the non-oxide layer 183, and the protective layer 11 are laminated on a substrate (not shown in FIGS. 6A, 6B, and 6B) in the stated order. A method of forming each layer is not particularly limited, and sputtering or the like can be appropriately applied. Further, the formed laminate can be configured in a columnar shape as a whole, for example.

It should be noted that the magnetic body layer 123 does not include the outer circumferential portion 121 and the center portion 122. The magnetic body layer 123 is a layer that can be the storage layer 12 in a later step.

For the non-oxide layer 183, a metal material susceptible to oxidation, such as Mg or Al, or a non-metal material such as Li, can be used.

Subsequently, as shown in FIG. 6B, the outer circumferences of the magnetic body layer 123, the non-oxide layer 183, and the protective layer 11 are removed by performing photolithography or the like on the laminate of FIG. 6A. This enables the magnetic body layer 123, the non-oxide layer 183, and the protective layer 11 to have a columnar shape smaller than a planar shape of each layer of the intermediate layer 13 and below.

It should be noted that in this step the outer circumference of the protective layer 11 may not be removed.

Lastly, the non-oxide layer 183 is subjected to oxidation treatment. For the oxidation treatment, natural oxidation or plasma oxidation can be performed in an atmosphere containing oxygen, for example. Accordingly, as shown in FIG. 6C, a region in which the outer circumference is oxidized and a region in which the inside is not sufficiently oxidized are formed in the non-oxide layer 183. Consequently, the first region 181 with favorable crystallinity and the second region 182 with degraded crystallinity can be formed.

Furthermore, heat treatment can also be performed. The temperature of the heat treatment can range from, for example, 300° C. to 400° C. Accordingly, a more stable oxide is formed in the first region 181, and Mg or the like is diffused from the second region 182 to the magnetic body layer 123 or the protective layer 11, so that crystallinity of the interface is degraded. Therefore, because of a difference in crystallinity of interfaces between the first region 181 and the magnetic body layer 123 and between the second region 182 and the magnetic body layer 123, a difference in perpendicular magnetic anisotropy can be caused inside the magnetic body layer 123, so that the storage layer 12 including the outer circumferential portion 121 and the center portion 122 can be formed.

Action and Effect of this Embodiment

As described above, according to this embodiment, the perpendicular magnetic anisotropy of the outer circumferential portion 121 is made higher than that of the center portion 122, and thus an initial direction of magnetization of the center portion 122 can be inclined from the perpendicular direction (the Z-axis direction). Accordingly, it is possible to maintain the magnetization of the outer circumferential portion 121 in the perpendicular direction and also suppress variations in initial angle of the magnetization in the center portion 122, to reduce errors without increasing a recording voltage (reverse current) also in short-pulse recording. Therefore, lowering in write speed or increase in power consumption can be suppressed.

Furthermore, according to this embodiment, as shown below, a minute device can also exert the action and effect described above.

FIGS. 7A and 7B are schematic diagrams showing a configuration of a storage device 50 according to a comparative example of this embodiment. FIG. 7A is a cross-sectional diagram, and FIG. 7B is a perspective diagram. It should be noted that the configurations of the storage device 50 similar to those of the storage device 10 are denoted by the same reference symbols and description thereof will be omitted.

As shown in the figures, the storage device 50 includes a base layer 17 (not shown in FIGS. 7A and 7B), a magnetic coupling layer 16, a coupling layer 15, a magnetization fixed layer 14, an intermediate layer 13, a storage layer 52, and a protective layer 11 (not shown in FIGS. 7A and 7B).

The storage layer 52 includes a perpendicular magnetic anisotropy layer 521, a magnetic coupling layer 522, and an in-plane magnetic anisotropy layer 523, to thus be constituted of a two-layer magnetic coupling film. The in-plane magnetic anisotropy layer 523 is inclined from the perpendicular direction (the Z-axis direction) by a coupling magnetic field from the perpendicular magnetic anisotropy layer 521.

FIG. 8 is a schematic cross-sectional diagram for more specifically describing a magnetized state of the storage device 50. In a case where the magnetization of the in-plane magnetic anisotropy layer 523 is inclined, a leakage magnetic field L is generated in the plane, and force (magnetostatic coupling) that inclines the magnetization of the in-plane magnetic anisotropy layer 523 to the direction opposite to the perpendicular magnetic anisotropy layer 521 and is about to form antiparallel magnetization can work. In such a manner, in a case where the magnetostatic coupling between the in-plane magnetic anisotropy layer 523 and the perpendicular magnetic anisotropy layer 521 has a large influence, it is difficult to stably keep the oblique magnetization of the in-plane magnetic anisotropy layer 523.

Furthermore, in a minute storage device, in order to ensure thermal stability, the magnetization quantity has to be increased by increasing the film thickness, using a material having a large saturation magnetic flux density, and the like. However, the magnetostatic coupling that can be generated in the storage device 50 is stronger as the device is made minuter and as the magnetization quantity is larger. As a result, in a minute storage device, the formation using a two-layer magnetic coupling film is difficult.

Meanwhile, as shown in FIG. 5, the storage device 10 of this embodiment maintains the oblique magnetization of the center portion 122 by a difference in perpendicular magnetic anisotropy between the outer circumferential portion 121 and the center portion 122 within the storage layer 12, and thus the magnetostatic coupling between two layers as described above is not formed. Furthermore, the outer circumferential portion 121 is formed around the center portion 122, and thus the center portion 122 can be prevented from being affected by the outside, e.g., a leakage magnetic field. Accordingly, according to this embodiment, stable oblique magnetization can be formed even when the device is made minute.

Further, according to the manufacturing method of this embodiment, the non-oxide layer 183 is formed on the magnetic body layer 123, oxidation treatment is performed thereon, and the oxide layer 18 including the first region 181 and the second region 182 that are different in crystallinity can thus be formed. Accordingly, it is possible to form the outer circumferential portion 121 and the center portion 122 that are different in perpendicular magnetic anisotropy without undergoing complicated steps, and to relatively easily manufacture even the minute storage device 10.

Modified Example 1-1

The storage device 10 is not limited to the configuration shown in FIG. 3 and can appropriately omit the layers other than the magnetization fixed layer 14, the intermediate layer 13, and the storage layer 12. Further, the shape of the storage device 10 is also not limited to a columnar shape.

Modified Example 1-2

In the manufacturing method of this embodiment, in addition to the steps described above, reduction treatment may be performed in a hydrogen atmosphere after the oxidation treatment. This can remove oxygen that has entered the magnetic body layer 123 or the like through the oxidation treatment.

Modified Example 1-3

The storage apparatus 100 has been described as including the plurality of storage devices 10 and the plurality of current supply control units 102. However, the present technology is not limited to this configuration and is also applicable to a case where the storage apparatus 100 includes one storage device 10 and one current supply control unit 102.

Second Embodiment

Figure 9:
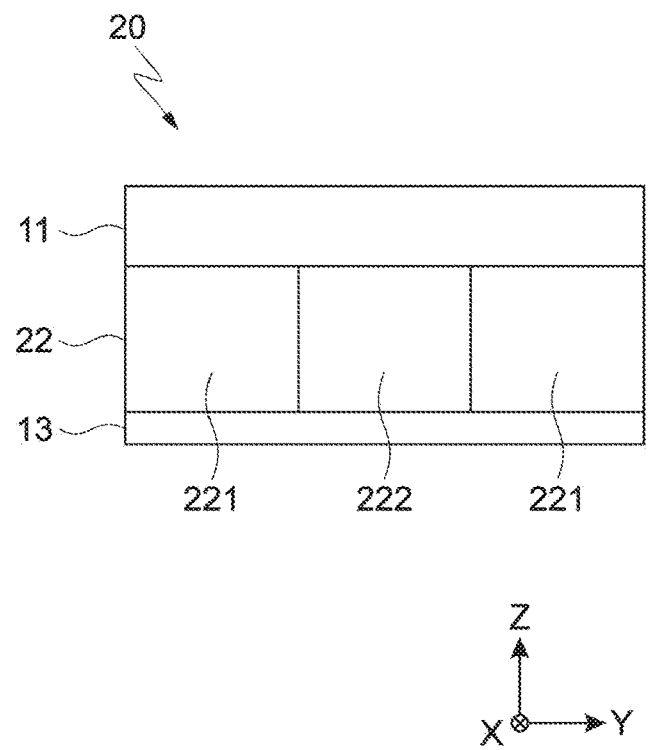
FIG. 9 is a cross-sectional diagram of a main part showing a configuration of a storage device according to a second embodiment of the present technology.

FIG. 9 is a cross-sectional diagram of a main part showing a configuration of a storage device 20 according to a second embodiment of the present technology. As shown in FIGS. 3 and 9, the storage device 20 includes a base layer 17, a magnetic coupling layer 16, a coupling layer 15, a magnetization fixed layer 14, an intermediate layer 13, a storage layer 22, and a protective layer 11. The storage layer 22 has a different configuration from the storage layer 12. It should be noted that in FIG. 9 the illustration of the base layer 17, the magnetic coupling layer 16, the coupling layer 15, and the magnetization fixed layer 14 is omitted.

It should be noted that the configurations of the storage device 20 similar to those of the storage device 10 are denoted by the same reference symbols and description thereof will be omitted.

[Configuration of Storage Layer]

The storage layer 22 includes an outer circumferential portion 221 and a center portion 222 as is the case with the storage layer 12.

The outer circumferential portion 221 faces the outside of the storage layer 22 and has magnetization in an orientation perpendicular to a film surface.

Furthermore, in this embodiment, the outer circumferential portion 221 contains a light element at a first composition ratio. The light element herein typically refers to elements to the third period of the periodic table, where transition metals do not appear. More specifically, the light element refers to B, C, O, N, or the like that belongs to the second period of the periodic table.

The center portion 222 is formed by being surrounded by the outer circumferential portion 221 and has magnetization inclined from the orientation perpendicular to the film surface. In other words, the center portion 222 has lower magnetic anisotropy than the outer circumferential portion 221 and forms magnetization obliquely inclined because of the influence of a demagnetizing field from the outer circumferential portion 221, or the like.

Further, in this embodiment, the center portion 22 contains a light element at a second composition ratio that is different from the first composition ratio.

For example, it is assumed that the light element includes at least one of B and C, and the second composition ratio is lower than the first composition ratio by 5% or more. It should be noted that the ratio used herein is assumed to represent a composition ratio of each element.

Figure 10:
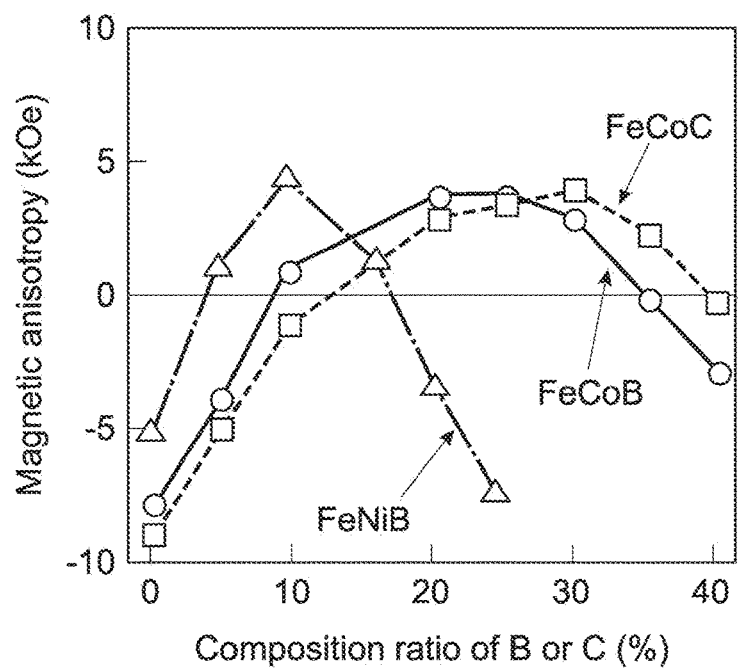
FIG. 10 is a graph showing changes in magnetic anisotropy at the time when a composition ratio of B or C is changed for a magnetic body layer containing FeCoB, FeCoC, or FeNiB, in which the horizontal axis represents a composition ratio (%) of B or C, and the vertical axis represents magnetic anisotropy (anisotropy field) (kOe).

FIG. 10 is a graph showing changes in magnetic anisotropy at the time when a composition ratio of B or C is changed for a magnetic body layer containing FeCoB, FeCoC, or FeNiB, in which the horizontal axis represents a composition ratio (%) of B or C, and the vertical axis represents magnetic anisotropy (anisotropy field) (kOe).

Samples used in an experiment were set to have a thickness of 1.5 nm. Further, in the figure, in a case where a value of magnetic anisotropy is a positive value, the film is a perpendicular magnetization film, and in a case where the value is a negative value, the film is an in-plane magnetization film.

As shown in the figure, FeCoB showed perpendicular magnetization at the composition ratio of B ranging from approximately 10% to approximately 30% and showed in-plane magnetization at the composition ratio of B of approximately 5% or less or approximately 35% or more.

Further, FeCoC showed perpendicular magnetization at the composition ratio of C ranging from approximately 15% to approximately 35% and showed in-plane magnetization at the composition ratio of C of approximately 10% or less.

Further, FeNiB showed perpendicular magnetization at the composition ratio of B ranging from approximately 5% to approximately 15% and showed in-plane magnetization at the composition ratio of B of 0% or approximately 20% or more.

From the results of FIG. 10, for example, in a case where the storage layer 22 is made of FeCoB, the outer circumferential portion 221 can be made of FeCoB having a composition whose composition ratio of B is 10% or more and 30% or less, and the center portion 222 can be made of FeCoB having a composition whose composition ratio of B is 5% or less or 35% or more.

Further, similarly, for example, in a case where the storage layer 22 is made of FeCoC, the outer circumferential portion 221 can be made of FeCoC having a composition whose composition ratio of C is 15% or more and 35% or less, and the center portion 222 can be made of FeCoC having a composition whose composition ratio of C is 10% or less.

Further, similarly, for example, in a case where the storage layer 22 is made of FeNiB, the outer circumferential portion 221 can be made of FeNiB having a composition whose composition ratio of B is 5% or more and 15% or less, and the center portion 222 can be made of FeNiB having a composition whose composition ratio of B is 0% or 20% or more.

From the results described above, it was observed that changing the compositions of the light elements can control the perpendicular magnetic anisotropy of the outer circumferential portion 221 and the center portion 222. This is probably because the perpendicular magnetic anisotropy changes along with a change in crystalline structure of the material of the storage layer 22.

Further, in order to obtain a difference between perpendicular magnetization and in-plane magnetization, the outer circumferential portion 221 only needs to have magnetic anisotropy of approximately +1 kOe or more, and the center portion 222 only needs to have magnetic anisotropy of approximately −1 kOe or less. Accordingly, from each graph of FIG. 10, it can be said that the composition ratio of B or C (the first composition ratio) of the center portion 222 only needs to be lower by 5% or more than the composition ratio (the second composition ratio) of the outer circumferential portion 221.

[Manufacturing Method for Storage Device]

FIGS. 11A, 11B, 11C, and 11D are schematic cross-sectional diagrams for describing a manufacturing method for the storage device of this embodiment. The manufacturing method according to this embodiment is different from the manufacturing method of the first embodiment described above in the step of forming the storage layer 22.

In other words, the step of forming the storage layer 22 in this embodiment includes supplying a light element from an outer circumferential surface of a magnetic body layer 223.

Furthermore, the step of supplying a light element from an outer circumferential surface of a magnetic body layer 223 may include forming a light element supply layer 28 that covers the outer circumferential surface of the magnetic body layer 223, and supplying the light element from the light element supply layer 28 to the magnetic body layer 223.

Hereinafter, description will be more specifically given with reference to FIGS. 11A, 11B, 11C, and 11D.

First, as shown in FIG. 11A, the base layer 17, the magnetic coupling layer 16, the coupling layer 15, the magnetization fixed layer 14, the intermediate layer 13, the magnetic body layer 223, and the protective layer 11 are laminated on a substrate (not shown in FIG. 11A) in the stated order.

In this embodiment, the magnetic body layer 223 is formed of, for example, FeCo and FeNi, or FeCoB, FeCoC, and FeNiB, or the like.

Subsequently, as shown in FIG. 11B, the outer circumferences of the magnetic body layer 223 and the protective layer 11 are removed by performing photolithography or the like on the laminate of FIG. 11A. This enables the magnetic body layer 223 and the protective layer 11 to have a columnar shape smaller than a planar shape of each layer of the intermediate layer 13 and below.

Subsequently, as shown in FIG. 11C, the light element supply layer 28 that covers the outer circumferential surfaces of the magnetic body layer 223 and the protective layer 11 is formed. The light element supply layer 28 is a layer containing a light element such as B or C and may be a film made of, for example, B or C alone or a film abundantly containing B or C, such as BOC or hydrocarbon.

The light element supply layer 28 can be formed by, for example, sputtering.

Further, the light element supply layer 28 only needs to cover the outer circumferential surface of at least the magnetic body layer 223 and may not cover other layers such as the protective layer 11.

Subsequently, the light element is supplied from the light element supply layer 28 to the magnetic body layer 223. For a supply method, for example, heat treatment or the like can be applied. Conditions of the heat treatment can be appropriately set in view of conditions of diffusion or the like of the light element contained in the light element supply layer 28.

Lastly, as shown in FIG. 11D, the light element supply layer 28 is removed by etching or the like. Accordingly, the storage device 20 can be formed.

It should be noted that in a case where the light element supply layer 28 does not electrically and mechanically have negative influence on the storage device 20, the light element supply layer 28 may not be removed.

Action and Effect of this Embodiment

As described above, according to this embodiment as well, as is the case with the first embodiment, it is possible to maintain the magnetization of the outer circumferential portion 221 in the perpendicular direction and also suppress variations in initial angle of the magnetization in the center portion 222, to reduce errors without increasing a recording voltage (reverse current) also in short-pulse recording. Therefore, lowering in write speed or increase in power consumption can be suppressed.

Further, stable oblique magnetization can be formed even when the device is made minute.

Further, according to the manufacturing method of this embodiment as well, the light element supply layer 28 that covers the outer circumferential surface of the magnetic body layer 223 is formed, heat treatment or the like is performed, and the outer circumferential portion 221 and the center portion 222 that are different in perpendicular magnetic anisotropy can thus be formed. Therefore, it is possible to relatively easily manufacture even the minute storage device 20.

Modified Example 2-1

The second embodiment has described the example containing B or C as a light element, but the light element may be O or N, for example.

Figure 12:
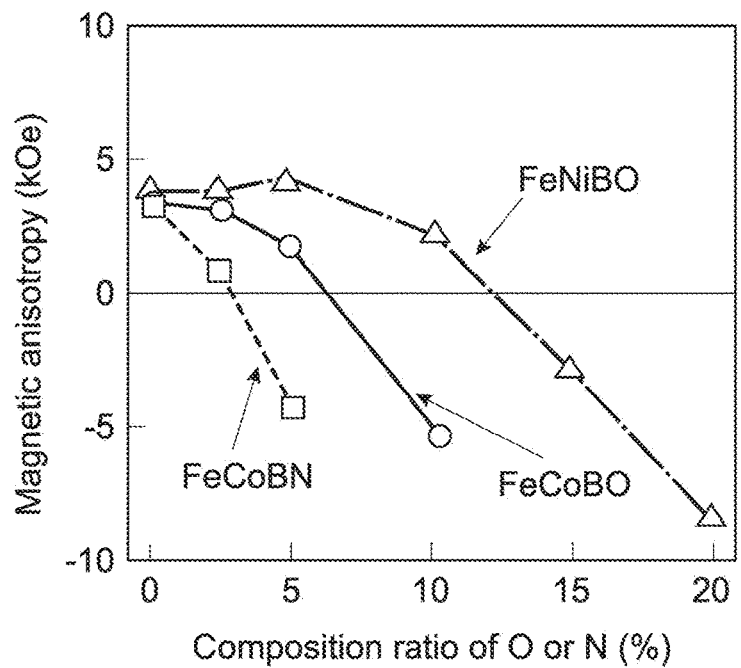
FIG. 12 is a graph showing changes in magnetic anisotropy at the time when a composition ratio of O or N is changed for a magnetic body layer containing FeCoBO, FeNiBO, or FeCoBN, in which the horizontal axis represents a composition ratio (%) of O or N, and the vertical axis represents magnetic anisotropy (anisotropy field) (kOe).

FIG. 12 is a graph showing changes in magnetic anisotropy at the time when a composition ratio of O or N is changed for a magnetic body layer containing FeCoBO, FeNiBO, or FeCoBN, in which the horizontal axis represents a composition ratio (%) of O or N, and the vertical axis represents magnetic anisotropy (anisotropy field) (kOe). It should be noted that each layer used in the experiment was set to have a thickness of 1.5 nm, as is the case with the example shown in FIG. 10.

As shown in the figure, along with addition of O or N, it was found that the perpendicular magnetic anisotropy tends to decrease. Specifically, FeCoBO had in-plane magnetization at the composition ratio of O of 10% or more, FeNiBO had in-plane magnetization at the composition ratio of O of 15% or more, and FeCoBN had in-plane magnetization at the composition ratio of N of 5% or more.

Accordingly, for example, in a case where the storage layer 22 is made of FeCoBO, the outer circumferential portion 221 can be made of FeCoBO having a composition whose composition ratio of O is 5% or less, and the center portion 222 can be made of FeCoBO having a composition whose composition ratio of O is 10% or more.

Further, similarly, for example, in a case where the storage layer 22 is made of FeNiBO, the outer circumferential portion 221 can be made of FeNiBO having a composition whose composition ratio of O is 10% or less, and the center portion 222 can be made of FeNiBO having a composition whose composition ratio of O is 15% or more.

Further, similarly, for example, in a case where the storage layer 22 is made of FeCoBN, the outer circumferential portion 221 can be made of FeCoBN having a composition whose composition ratio of N is 3% or less, and the center portion 222 can be made of FeCoBN having a composition whose composition ratio of N is 5% or more.

Further, from each graph of FIG. 12, in order to obtain a difference between perpendicular magnetization and in-plane magnetization, it can be said that the composition ratio (the first composition ratio) of O or N of the center portion 222 only needs to be higher by 2% or more than the composition ratio (the second composition ratio) of the outer circumferential portion 221.

In the manufacturing method according to this modified example, the step of forming the outer circumferential portion 221 and the center portion 222 in the magnetic body layer 223 may include removing a light element from an outer circumferential surface of the magnetic body layer 223.

In this case, the magnetic body layer 223 is formed of, for example, FeCoBO at the composition ratio of O of 10% or more, FeCoBN at the composition ratio of N of 5% or more, or FeNiBO at the composition ratio of O of 15% or more.

Specifically, as is the case with the light element supply layer 28 shown in FIG. 11C, a light element adsorption layer that covers the outer circumferential surface of at least the magnetic body layer 223 can be formed. For a material of the light element adsorption layer, metal highly reactive with at least one of O and N, such as Mg, Al, La, Ta, Ti, Zr, Nb, or Hf, can be used.

After the light element adsorption layer is formed, the light element adsorption layer is then caused to adsorb a light element under predetermined conditions of heat treatment or the like. Thus, the outer circumferential portion 221 and the center portion 222 containing O or N at a predetermined composition ratio can be formed. Conditions of this processing can be appropriately set in view of reaction conditions of the material contained in the light element adsorption layer.

Alternatively, as a method of removing O from the outer circumferential surface of the magnetic body layer 223, reduction treatment may be performed in a hydrogen atmosphere.

Modified Example 2-2

The second embodiment has described that the light element is supplied from the outer circumferential surface of the magnetic body layer 223 by the light element supply layer 28, but the present technology is not limited thereto. As a method of supplying a light element from the outer circumferential surface of the magnetic body layer 223, for example, atoms of B or C may be injected directly to the magnetic body layer 223 by ion implantation or the like, or the magnetic body layer 223 may be exposed to gas containing B or C.

Third Embodiment

Figure 13:
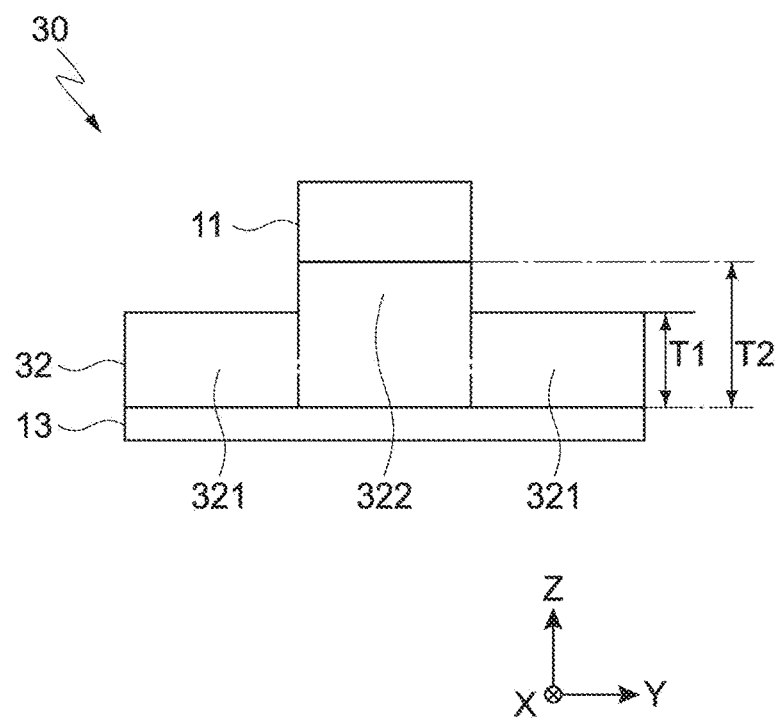
FIG. 13 is a cross-sectional diagram of a main part showing a configuration of a storage device according to a third embodiment of the present technology.

FIG. 13 is a cross-sectional diagram of a main part showing a configuration of a storage device 30 according to a third embodiment of the present technology. As shown in FIGS. 3 and 13, the storage device 30 includes a base layer 17, a magnetic coupling layer 16, a coupling layer 15, a magnetization fixed layer 14, an intermediate layer 13, a storage layer 32, and a protective layer 11. The storage layer 32 has a different configuration from the storage layer 12. It should be noted that in FIG. 13 the illustration of the base layer 17, the magnetic coupling layer 16, the coupling layer 15, and the magnetization fixed layer 14 is omitted.

It should be noted that the configurations of the storage device 30 similar to those of the storage device 10 are denoted by the same reference symbols and description thereof will be omitted.

[Configuration of Storage Layer]

The storage layer 32 includes an outer circumferential portion 321 and a center portion 322 as is the case with the storage layer 12.

The outer circumferential portion 321 faces the outside of the storage layer 32 and has magnetization in an orientation perpendicular to a film surface.

Furthermore, in this embodiment, the outer circumferential portion 321 has a first thickness T1. Specifically, the first thickness T1 can be set to approximately 1.5 nm to 1.7 nm.

The center portion 322 is formed by being surrounded by the outer circumferential portion 321 and has magnetization inclined from the orientation perpendicular to the film surface. In other words, the center portion 322 has lower magnetic anisotropy than the outer circumferential portion 321 and forms magnetization obliquely inclined because of the influence of a demagnetizing field from the outer circumferential portion 321, or the like.

Further, in this embodiment, the center portion 322 has a second thickness T2 larger than the first thickness T1. Specifically, the second thickness T2 can be set to approximately 2.0 nm to 2.5 nm and approximately 1.2 to 1.7 times as large as the first thickness T1.

Figure 14:
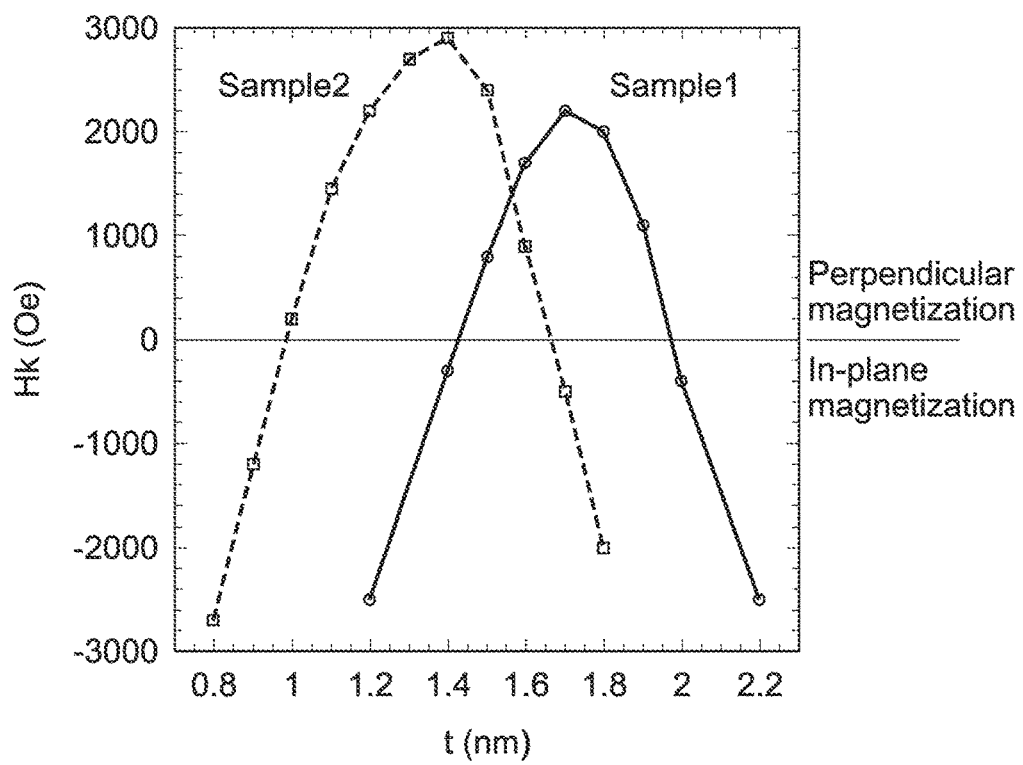
FIG. 14 is a graph showing changes in magnetic anisotropy at the time when the thickness of the magnetic body layer is changed, in which the horizontal axis represents a thickness t (nm) of the magnetic body layer, and the vertical axis represents magnetic anisotropy (anisotropy field) (Oe).

FIG. 14 is a graph showing changes in magnetic anisotropy at the time when the thickness of the magnetic body layer is changed, in which the horizontal axis represents a thickness t (nm) of the magnetic body layer, and the vertical axis represents magnetic anisotropy (anisotropy field) (Oe).

Figure 15:
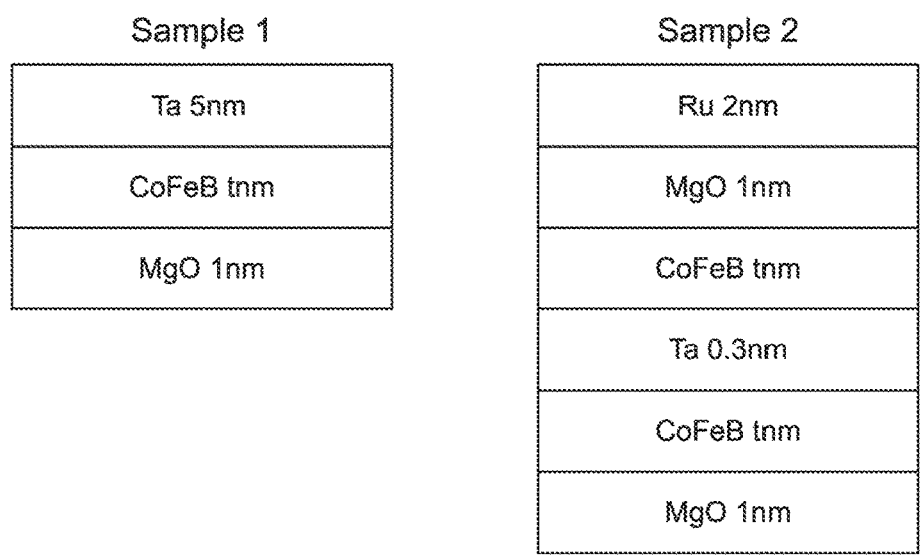
FIG. 15 is a diagram showing configurations of samples 1 and 2 used in the experiment shown in FIG. 14.

Further, FIG. 15 is a diagram showing configurations of samples 1 and 2 used in the experiment shown in FIG. 14.

As shown in FIG. 15, the sample 1 is a laminate of an MgO film of 1 nm, an FeCoB film (magnetic body layer) of t nm, and a Ta film of 5 nm.

Further, the sample 2 is a laminate of an MgO film of 1 nm, an FeCoB film (magnetic body layer) of t nm, a Ta film of 0.3 nm, an FeCoB film (magnetic body layer) of t nm, an MgO film of 1 nm, and an Ru film of 2 nm.

As shown in FIG. 14, the sample 1 indicated by the solid line had perpendicular magnetization when the thickness t of the magnetic body layer was approximately 1.5 nm to 1.9 nm, and had in-plane magnetization when t was approximately 1.4 nm or less or approximately 2 nm or more.

Meanwhile, the sample 2 indicated by the broken line had perpendicular magnetization when the thickness t of the magnetic body layer was approximately 1.0 nm to approximately 1.6 nm, and had in-plane magnetization when t was approximately 0.9 nm or less or approximately 1.6 nm or more.

From the results of FIG. 14, it was observed that the magnetic body layer has different magnetic anisotropies on the basis of the thickness. Thus, it was observed that, also in the storage layer 32 of this embodiment, changing the thickness of the outer circumferential portion 321 and the thickness of the center portion 322 can control the magnetic anisotropy.

Further, this is probably because of the following, i.e., in the storage layer 32, the crystalline structure or the like is controlled on the basis of crystallinity of an interface of the intermediate layer 13 and the magnetic anisotropy is thus changed, but as the thickness is thicker, the influence of the intermediate layer 13 on the storage layer 32 is smaller. Therefore, it is probable that the crystalline structure is disturbed and the perpendicular magnetic anisotropy is weakened in the thicker center portion 322 as compared with the thinner outer circumferential portion 321.

[Manufacturing Method for Storage Device]

FIGS. 16A, 16B, 16C, 16D, and 16E are schematic cross-sectional diagrams for describing a manufacturing method for the storage device of this embodiment. The manufacturing method according to this embodiment is different from the manufacturing method of the first embodiment described above in the step of forming the outer circumferential portion 221 and the center portion 222 in a magnetic body layer 223.

In other words, the step of forming the outer circumferential portion 321 and the center portion 322 in the magnetic body layer 323 in this embodiment includes forming a mask pattern on an upper portion of the center portion 322, and etching a part of the outer circumferential portion 321 via the mask pattern.

Furthermore, the protective layer 11 may be formed on the magnetic body layer 323, and the step of forming the mask pattern on an upper portion of the center portion 322 may include forming the mask pattern on the protective layer 11.

Hereinafter, description will be more specifically given with reference to FIGS. 16A, 16B, 16C, 16D, and 16E.

First, as shown in FIG. 16A, the base layer 17, the magnetic coupling layer 16, the coupling layer 15, the magnetization fixed layer 14, the intermediate layer 13, the magnetic body layer 323, and the protective layer 11 are laminated on a substrate (not shown in FIG. 16A) in the stated order.

Further, in this embodiment, a hard mask film M31 is formed on the protective layer 11. For the hard mask film M31, a material capable of easily controlling an etching speed by an etching method, etching conditions, or the like can be used and may be, for example, metal such as Ti, W, or Ru, a nitride such as TiN or TaN, or diamond-like carbon.

Subsequently, as shown in FIG. 16B, the hard mask film M31 is patterned by photolithography or the like to form a mask pattern M32.

Subsequently, as shown in FIG. 16C, a part of the protective layer 11 is etched via the mask pattern M32 under a first etching condition. As the first etching condition, for example, a condition to increase an etching speed of the protective layer 11 relative to the mask pattern M32 can be applied.

A part of the protective layer 11 is etched. Thus, in a subsequent step of etching the magnetic body layer 323, a region of the magnetic body layer 323, which is disposed below the thin part of the protective layer 11, is easier to be removed than a region of the magnetic body layer 323, which is disposed below the thick part of the protective layer 11. As will be described later, this enables the storage layer 32 and the protective layer 11 to have a planar shape smaller than a planar shape of each layer of the intermediate layer 13 and below.

Subsequently, as shown in FIG. 16D, the mask pattern M32 is selectively etched to reduce the mask pattern M32, and a mask pattern M33 is formed.

Lastly, as shown in FIG. 16E, a part of the magnetic body layer 323 is etched via the reduced mask pattern M33 under a second etching condition. As the second etching condition, for example, a condition to increase an etching speed of the protective layer 11 and the magnetic body layer 323 relative to the mask pattern M33 can be applied.

Thus, in the magnetic body layer 323, the region disposed below the thin part of the protective layer 11 is removed, and the region disposed below the thick part of the protective layer 11 and exposed from the mask pattern M33 is partially removed. Further, in the magnetic body layer 323, the region below the mask pattern M33 is left together with a part of the protective layer 11.

Therefore, this step enables the storage layer 32 and the protective layer 11 to have a planar shape smaller than a planar shape of each layer of the intermediate layer 13 and below and enables a part of the outer circumferential portion 321 to be etched, to form the storage device 30.

Action and Effect of this Embodiment

As described above, according to this embodiment as well, as is the case with the first embodiment, it is possible to maintain the magnetization of the outer circumferential portion 321 in the perpendicular direction and also suppress variations in initial angle of the magnetization in the center portion 322, to reduce errors without increasing a recording voltage (reverse current) also in short-pulse recording. Therefore, lowering in write speed or increase in power consumption can be suppressed.

Further, stable oblique magnetization can be formed even when the device is made minute.

Further, by the manufacturing method of this embodiment, both the formation of a columnar shape of the storage layer 32 and the formation of the outer circumferential portion 321 and the center portion 322 of the storage layer 32 can be achieved using the single hard mask film M31. This makes it possible to form the storage device 30 by a relatively easy method without using a plurality of masks.

Modified Example 3-1

The manufacturing method for the storage device 30 is an example, and the present technology is not limited to the method described above.

For example, as shown in FIGS. 7A and 7B or the like, after the outer circumferences of the protective layer 11 and the magnetic body layer 323 are removed by photolithography or the like, a mask pattern may be formed and a part of the outer circumferential portions may be etched via the mask pattern.

Fourth Embodiment

Figure 17:
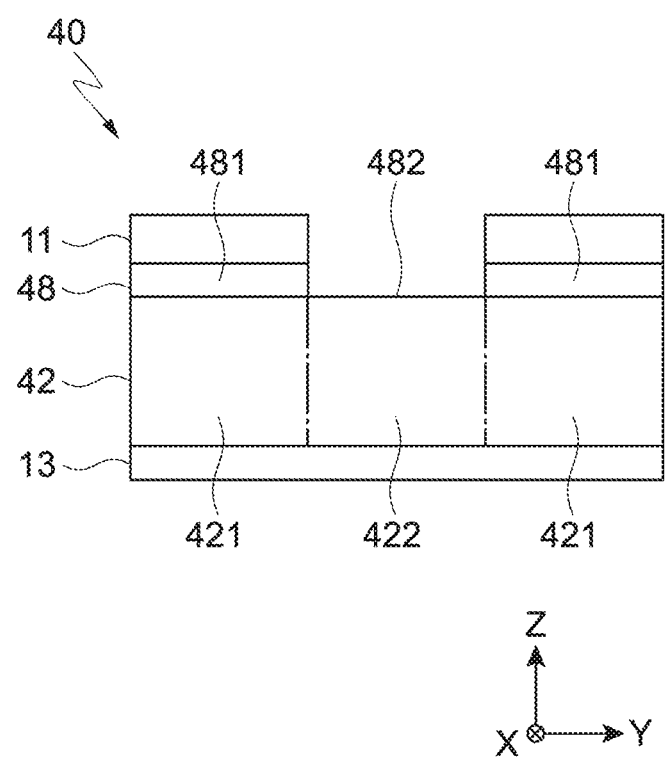
FIG. 17 is a cross-sectional diagram of a main part showing a configuration of a storage device according to a fourth embodiment of the present technology.

FIG. 17 is a cross-sectional diagram of a main part showing a configuration of a storage device 40 according to a fourth embodiment of the present technology. As shown in FIGS. 3 and 17, the storage device 40 includes a base layer 17, a magnetic coupling layer 16, a coupling layer 15, a magnetization fixed layer 14, an intermediate layer 13, a storage layer 42, an oxide layer 48, and a protective layer 11. The storage layer 42 and the oxide layer 48 are respectively different from the storage layer 12 and the oxide layer 18 in configuration. It should be noted that in FIG. 17 the illustration of the base layer 17, the magnetic coupling layer 16, the coupling layer 15, and the magnetization fixed layer 14 is omitted.

It should be noted that the configurations of the storage device 40 similar to those of the storage device 10 are denoted by the same reference symbols and description thereof will be omitted.

[Configuration of Storage Layer]

The storage layer 42 includes an outer circumferential portion 421 and a center portion 422 as is the case with the storage layer 12.

The outer circumferential portion 421 faces the outside of the storage layer 42 and has magnetization in an orientation perpendicular to a film surface. The outer circumferential portion 421 has high perpendicular magnetic anisotropy.

The center portion 422 is formed by being surrounded by the outer circumferential portion 421 and has magnetization inclined from the orientation perpendicular to the film surface. In other words, the center portion 422 has lower magnetic anisotropy than the outer circumferential portion 421 and forms magnetization obliquely inclined because of the influence of a demagnetizing field from the outer circumferential portion 421, or the like.

The oxide layer 48 is disposed on the storage layer 42 on the opposite side to the intermediate layer 13 and is configured to be capable of making the perpendicular magnetic anisotropy of the outer circumferential portion 421 higher than the perpendicular magnetic anisotropy of the center portion 422 on the basis of crystallinity of the interface with the storage layer 42.

The oxide layer 48 includes a first region 481 disposed on the outer circumferential portion 421 and a second region 482 disposed on the center portion 422.

As is the case with the first region 181, the first region 481 can be a region having more favorable crystallinity. In other words, a material of the first region 481 can be a material having a stoichiometric composition and being sufficiently oxidized, and MgO, $Al_2O_3$, or the like can be applied, for example.

Meanwhile, the second region 482 is configured as a space in this embodiment. In other words, the oxide layer 48 can be configured into a tube having a space therein.

Accordingly, the center portion 422 facing the second region 482 is not affected by the crystallinity of the oxide layer 48, and thus the crystallinity can be degraded. Accordingly, the crystallinity of the outer circumferential portion 421 being in contact with the first region 481 can be made more favorable than the crystallinity of the center portion 422. Accordingly, it is possible to cause spontaneous magnetization of the outer circumferential portion 421 to be easily oriented in the Z-axis direction and consequently make the perpendicular magnetic anisotropy of the outer circumferential portion 421 higher than the perpendicular magnetic anisotropy of the center portion 422.

[Manufacturing Method for Storage Device]

FIGS. 18A, 18B, 18C, 18D, 18E, and 18F are schematic cross-sectional diagrams for describing a manufacturing method for the storage device of this embodiment. The manufacturing method according to this embodiment is different from the manufacturing method of the first embodiment described above in the step of forming the storage layer 42.

In other words, the step of forming the outer circumferential portion 421 and the center portion 422 in a magnetic body layer 423 in this embodiment may include forming the oxide layer 48 on the magnetic body layer 423, forming a mask pattern on an upper portion of the oxide layer 48, and etching the center of the oxide layer 423 via the mask pattern under a predetermined etching condition.

Furthermore, the step of forming a mask pattern may include forming a first mask pattern including a first mask portion and a second mask portion, the first mask portion being formed on an upper portion of the outer circumferential portion 421, the second mask portion being formed on an upper portion of the center portion and being thinner than the first mask portion, and the step of etching may include removing the second mask portion and removing at least a part of the oxide layer 423 via the first mask portion.

Hereinafter, description will be more specifically given with reference to FIGS. 18A, 18B, 18C, 18D, 18E, and 18F.

Figure 18A:
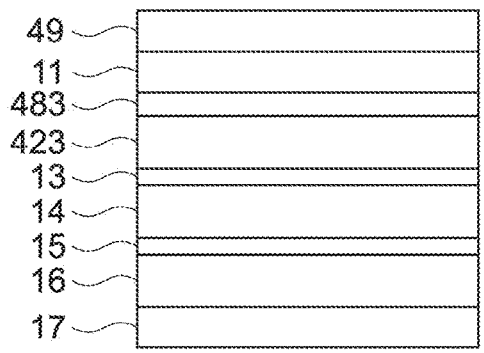
FIGS. 18A, 18B, 18C, 18D, 18E, and 18F are schematic cross-sectional diagrams for describing a manufacturing method for the storage device.

First, as shown in FIG. 18A, the base layer 17, the magnetic coupling layer 16, the coupling layer 15, the magnetization fixed layer 14, the intermediate layer 13, the magnetic body layer 423, the oxide layer 48, and the protective layer 11 are laminated on a substrate (not shown in FIG. 18A) in the stated order.

Furthermore, in this embodiment, an anti-polishing film 49 is formed on the protective layer 11. For the anti-polishing film 49, a material resistant to mechanical polishing or chemical polishing can be used. Such a material may be, specifically, metal such as Ti, W, or Ta, a nitride such as TiN, TaN, SiN, or AlN, a carbide such as TiC or SiC, an oxide such as $SiO_2$ or $Al_2O_3$, diamond-like carbon, or the like.

Figure 18B:
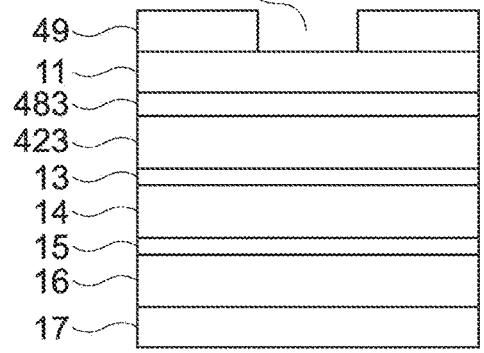

Subsequently, as shown in FIG. 18B, a hole portion 49a is formed in the anti-polishing film 49 by photolithography or the like. The hole portion 49a is for embedding hard mask films to be described later and can reach the protective layer 11.

Figure 18C:
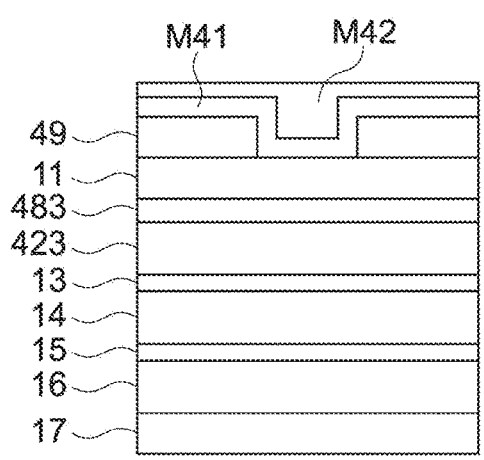

Subsequently, as shown in FIG. 18C, a first hard mask film M41 and a second hard mask film M42 are formed on the anti-polishing film 49 including the hole portion 49a.

Figure 18D:
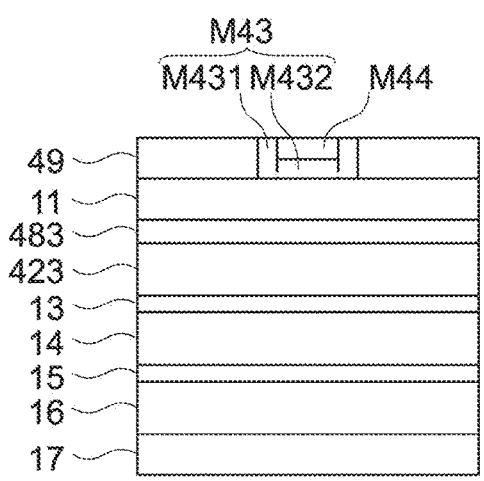

Furthermore, as shown in FIG. 18D, the surfaces of the second hard mask film M42 and the first hard mask film M41 are planarized to the surface of the anti-polishing film 49 by polishing or the like. Accordingly, only the first and second hard mask films M41 and M42 formed in the hole portion 49a are left.

In other words, by removal of the first hard mask film M41, a first mask pattern M43 is formed. The first mask pattern M43 includes a first mask portion M431 formed on the upper portion of the outer circumferential portion 421 and a second mask portion M432 that is formed on the upper portion of the center portion 422 and is thinner than the first mask portion M431.

Further, by removal of the second hard mask film M42, a second mask pattern M44 is formed on the second mask portion M432 of the first mask pattern M43.

A material of the first mask pattern M43 (the first hard mask film M41) may be metal such as Ti, W, or Ta, or a nitride such as TiN or TaN.

The second mask pattern M44 (the second hard mask film M42) can have a higher etching rate than the first mask pattern M43 under predetermined conditions.

Figure 18E:
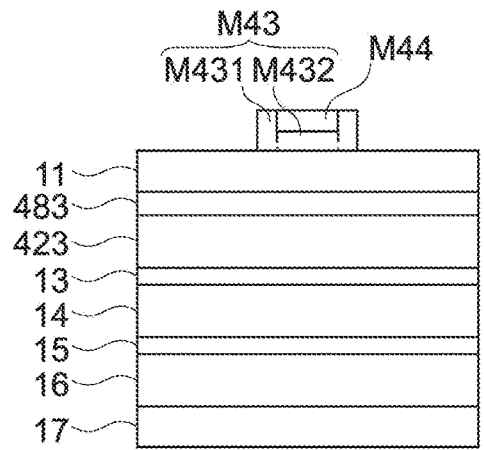

Subsequently, as shown in FIG. 18E, the anti-polishing film 49 is removed by reactive etching or the like. Accordingly, only the first and second mask patterns M43 and M44 are left on the protective layer 11.

Figure 18F:
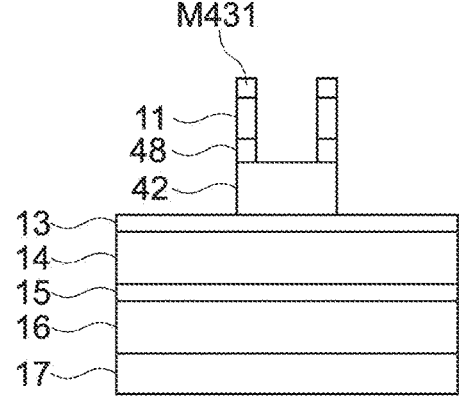

Subsequently, as shown in FIG. 18F, under predetermined etching conditions, the second mask portion M432 and the second mask pattern M44 on the second mask portion M432 are removed. A part of the oxide layer 48 is then removed via the first mask portion M431.

Accordingly, the center portions of the protective layer 11 and the oxide layer 48 are removed together with the second mask pattern M44, and the outer circumferential portions of the protective layer 11 and the oxide layer 48 are left in a ring shape.

Furthermore, on the basis of crystallinity of the interface of the oxide layer 48, the storage layer 42 including the outer circumferential portion 421 and the center portion 422 are formed, and the storage device 40 can thus be formed.

Action and Effect of this Embodiment

As described above, according to this embodiment as well, as is the case with the first embodiment, it is possible to maintain the magnetization of the outer circumferential portion 421 in the perpendicular direction and also suppress variations in initial angle of the magnetization in the center portion 422, to reduce errors without increasing a recording voltage (reverse current) also in short-pulse recording. Therefore, lowering in write speed or increase in power consumption can be suppressed.

Further, stable oblique magnetization can be formed even when the device is made minute.

Modified Example 4-1

Figure 19:
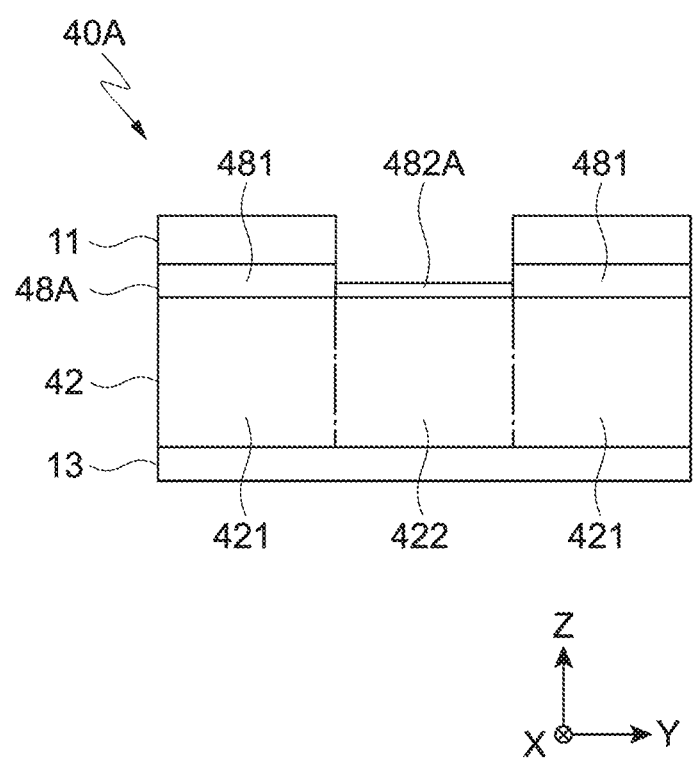
FIG. 19 is a cross-sectional diagram of a main part showing a configuration of a storage device according to Modified Example 4-1.

FIG. 19 is a cross-sectional diagram of a main part showing a configuration of a storage device 40A according to this modified example.

As shown in the figure, a second region 482A of an oxide layer 48A may be configured to be thinner than the first region 481. The second region 482A is made very thin and can thus be a region with degraded crystallinity relative to that of the first region 481. Therefore, as is the case with the first embodiment, the storage layer 42 including the outer circumferential portion 421 and the center portion 422 can be formed on the basis of a difference in crystallinity of the interface of the oxide layer 48A.

It should be noted that as a manufacturing method for the storage device 40A, a method similar to the above-mentioned manufacturing method for the storage device 40 can be applied. In other words, in the step of removing a part of the oxide layer via the first mask portion, the oxide layer is removed with the center portion (the second region) being slightly left, so that the storage device 40A can be manufactured.

Modified Example 4-2

The manufacturing method for the storage device 40 is not limited to the method described above.

For example, a mask pattern having a planar ring shape may be formed on the upper portion of the oxide layer 48, and the center of the oxide layer 48 may be etched via the mask pattern under predetermined etching conditions.

Alternatively, a first mask pattern is formed on the upper portion of the oxide layer 48. The first mask pattern includes a first mask portion formed on the upper portion of the outer circumferential portion 421 and a second mask portion that is formed on the upper portion of the center portion 422 and is thinner than the first mask portion. In other words, the mask pattern described above includes a thick outer circumferential portion and a recess portion formed at the center portion. Even if the center of the oxide layer is etched via such a mask pattern under predetermined etching conditions, the oxide layer 48 of this embodiment can be formed.

Other Modified Examples

Furthermore, the present technology is not limited to the embodiments described above and can be variously modified without departing from the gist of the present disclosure. Further, the first to fourth embodiments described above can be executed in various combinations as long as the inconsistency does not occur.

For example, the storage devices 10, 20, 30, and 40 of the present technology can be applied not only to the above-mentioned storage apparatus 100 but also to a magnetic head, a hard disk drive equipped with the magnetic head, and an integrated circuit chip, and further to various electronic apparatuses or electric apparatuses including a personal computer, a portable terminal, a mobile phone, and a magnetic sensor device.

Figure 20A:
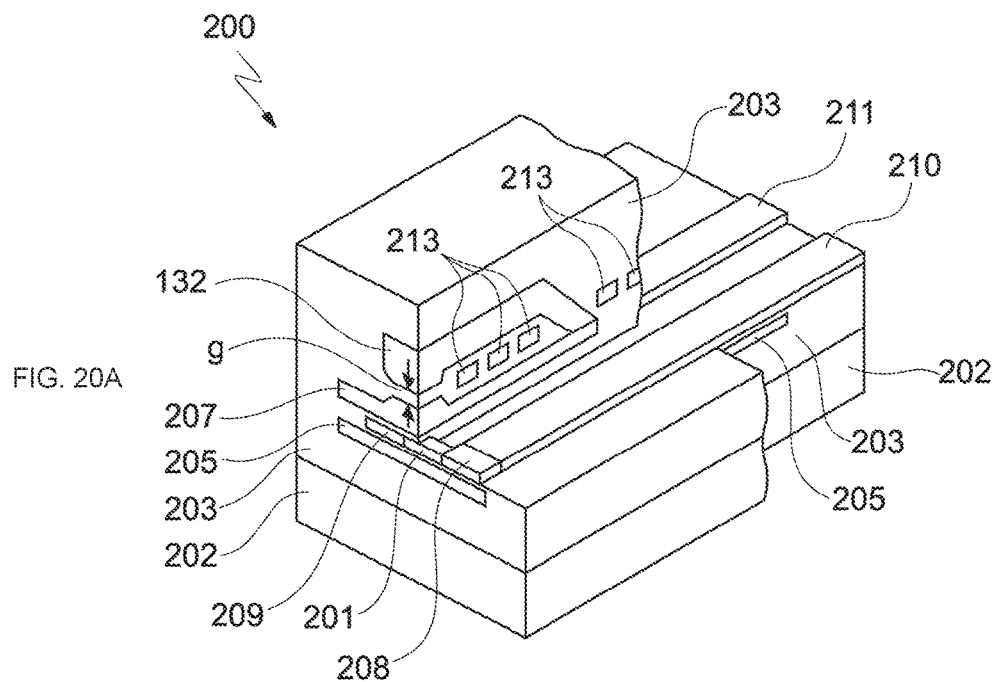
FIGS. 20A and 20B are views showing an example in which a magnetoresistive effect device having the structure of a storage device according to an embodiment of the present technology is applied to a composite magnetic head.
Figure 20B:
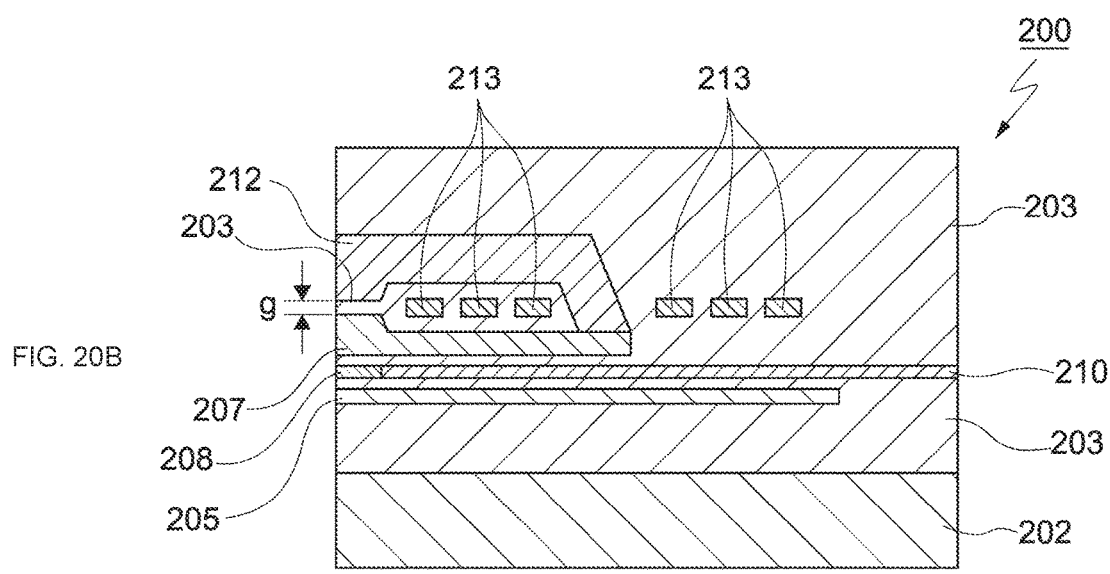

As an example, FIGS. 20A and 20B show an example in which a magnetoresistive effect device 201 having the structure of the storage device 10 described above is applied to a composite magnetic head 200. It should be noted that FIG. 20A is a partially cut-away perspective view of the composite magnetic head 200 to illustrate its internal structure, and FIG. 20B is a cross-sectional view of the composite magnetic head 200.

The composite magnetic head 200 is a magnetic head used in a hard disk apparatus or the like, and includes, on a substrate 202, a magnetoresistive effect type magnetic head to which the technology of the present disclosure is applied, and on the magnetoresistive effect type magnetic head, an inductive type magnetic head by lamination. Here, the magnetoresistive effect type magnetic head is configured to operate as a playback head, while the inductive type magnetic head is configured to operate as a recording head. In other words, the composite magnetic head 200 is constituted by combining a playback head and a recording head.

The magnetoresistive effect type magnetic head that is mounted on the composite magnetic head 200 is a so-called shield type MR head, and includes a first magnetic shield 205, the magnetoresistive effect device 201, and a second magnetic shield 207. The first magnetic shield 205 is formed on the substrate 202 with an insulating layer 203 therebetween. The magnetoresistive effect device 201 is formed on the first magnetic shield 205 with the insulating layer 203 therebetween. The second magnetic shield 207 is formed on the magnetoresistive effect device 201 with the insulating layer 203 therebetween. The insulating layer 203 is made of an insulating material such as $Al_2O_3$ or $SiO_2$.

The first magnetic shield 205 is configured to magnetically shield the lower layer side of the magnetoresistive effect device 201, and is made of a soft magnetic material such as Ni—Fe. On the first magnetic shield 205, the magnetoresistive effect device 201 is formed with the insulating layer 203 therebetween.

The magnetoresistive effect device 201 functions, in the magnetoresistive effect type magnetic head, as a magneto-sensitive device that detects a magnetic signal from a magnetic recording medium. Moreover, the magnetoresistive effect device 201 has a similar film structure to that of the storage device 10 described above.

The magnetoresistive effect device 201 is formed in a substantially square shape, one side surface of which may be configured to be exposed to a surface that faces the magnetic recording medium. Moreover, bias layers 208 and 209 are provided on both ends of the magnetoresistive effect device 201. Further, connection terminals 210 and 211 that are connected to the bias layers 208 and 209 are formed. A sense current is supplied to the magnetoresistive effect device 201 via the connection terminals 210 and 211.

Furthermore, above the bias layers 208 and 209, the second magnetic shield 207 is provided with the insulating layer 203 therebetween.

The inductive type magnetic head that is formed by lamination on the above-mentioned magnetoresistive effect type magnetic head includes a magnetic core and a thin-film coil 213. The magnetic core is constituted of the second magnetic shield 207 and an upper core 212. The thin-film coil 213 is formed to be wound around the magnetic core.

The upper core 212 forms a closed magnetic path together with the second magnetic shield 202 to constitute the magnetic core of the inductive type magnetic head, and is made of a soft magnetic material such as Ni—Fe. Here, the second magnetic shield 207 and the upper core 212 are formed such that the front ends thereof are exposed to the surface that faces the magnetic recording medium and the rear ends thereof are in contact with each other. Here, the front ends of the second magnetic shield 207 and the upper core 212 are formed such that, in the surface that faces the magnetic recording medium, the second magnetic shield 207 and the upper core 212 are separated by a predetermined gap g.

In other words, in the composite magnetic head 200, the second magnetic shield 207 is configured to not only magnetically shield the upper layer side of the magnetoresistive effect device 126 but also is configured to serve as the magnetic core of the inductive type magnetic head; the second magnetic shield 207 and the upper core 212 constitute the magnetic core of the inductive type magnetic head. Moreover, the gap g serves as a magnetic gap for recording of the inductive type magnetic head.

Further, the thin-film coil 213 that is embedded in the insulating layer 203 is formed above the second magnetic shield 207. Here, the thin-film coil 213 is formed to be wound around the magnetic core constituted of the second magnetic shield 207 and the upper core 212. Although not illustrated, both ends of the thin-film coil 213 are exposed to the outside, and terminals that are formed on the both ends of the thin-film coil 213 serve as terminals for external connection of the inductive type magnetic head. In other words, in recording of a magnetic signal on the magnetic recording medium, the recording current is supplied to the thin-film coil 213 through those terminals for external connection.

The composite magnetic head 200 as described above incorporates the magnetoresistive effect type magnetic head as a playback head; the magnetoresistive effect type magnetic head includes, as the magneto-sensitive device that detects a magnetic signal from the magnetic recording medium, the magnetoresistive effect device 201 to which the technology of the present disclosure is applied. Moreover, since the magnetoresistive effect device 201 to which the technology of the present disclosure is applied exhibits very excellent characteristics as described above, the magnetoresistive effect type magnetic head can cope with a further increase in recording density of magnetic recording.

EXAMPLES

Hereinafter, Examples of the embodiments described above will be described.

Test Example 1

First, the following tests were performed using Example 1 configured as the storage device 10 of the first embodiment described above and Comparative Example 1.

FIGS. 21A and 21B are schematic diagrams showing configurations of samples according to Example 1 and Comparative Example 1. FIG. 21A shows a configuration of a laminate produced in the manufacturing process of a storage device of Example 1. FIG. 21B shows a configuration of a storage device according to Comparative Example 1.

The storage device according to Example 1 was produced as follows.

First, as shown in FIG. 21A, formed was a laminate including: laminated films of Ta of 5 nm and Ru of 2 nm as the base layer 17; CoPt of 2 nm as the magnetic coupling layer 16; Ru of 0.7 nm as the coupling layer 15; FeCoB of 1 nm as the magnetization fixed layer 14; MgO of 0.7 nm as the intermediate layer 13 (tunnel barrier layer); a laminated film of FeCoB of 1 nm, Ta of 0.2 nm, and FeCoB of 1 nm as the storage layer 12; Mg of 1.5 nm as the non-oxide layer 183; and a laminated film of Ru of 2 nm and Ta of 5 nm as the protective layer 1.

Subsequently, the laminate described above was formed into a columnar shape with a diameter of 40 nm. After oxidation treatment to be described later was performed on the laminate during a time period, reduction was performed in a hydrogen atmosphere, and then heat treatment was performed by 400° C. for one hour.

Meanwhile, as shown in FIG. 21B, the storage device according to Comparative Example 1 includes an MgO film of 0.5 nm as an oxide layer, instead of the non-oxide layer 183.

The storage device according to Comparative Example 1 was subjected to heat treatment by 400° C. for one hour before processing of the device, and the device was then formed. The oxidation treatment was not performed.

FIG. 22 is a graph showing the dependence of a coercive force and a horny ratio on an oxidation treatment time in oxidation treatment of the process of producing the storage device according to this Example 1. The horny ratio is a ratio of magnetoresistance, when an external magnetic field is eliminated, to saturation magnetoresistance.

As shown in the figure, it was observed that as the oxidation treatment time is longer, the coercive force increases and the horny ratio also increases.

Here, it is known that an obliquely-inclined magnetized state is obtained when the horny ratio is slightly smaller than 1, and the horny ratio of the storage layer can be set to 0.7 or more and less than 1. Accordingly, an oxidation time applied to Example 1 was set to an oxidation time in which the horny ratio was approximately 0.9, that is, 100 seconds.

Figure 23:
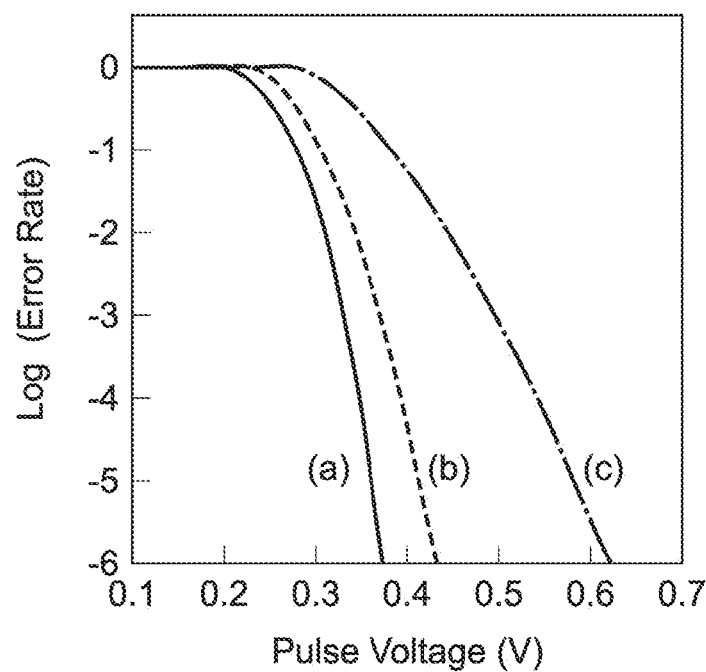
FIG. 23 is a graph showing the pulse voltage dependence of an error rate of a device according to Comparative Example 1 of Test Example 1.
Figure 24:
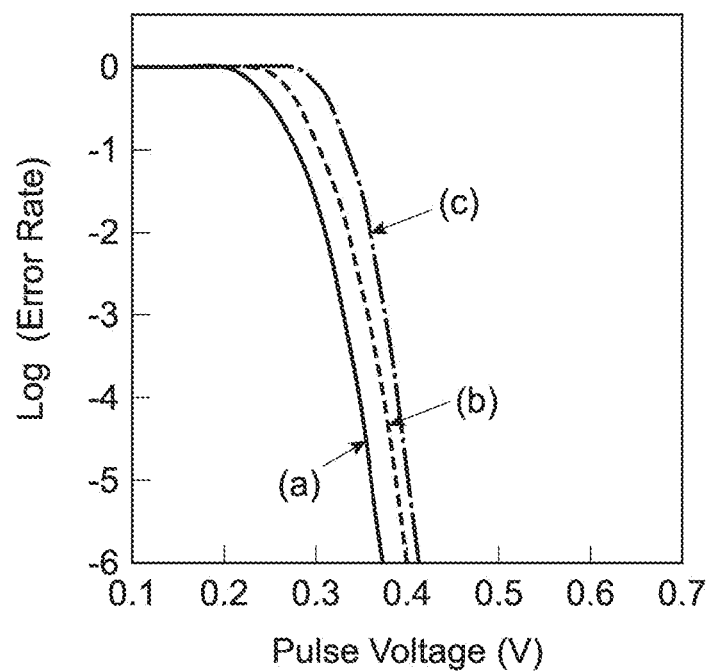
FIG. 24 is a graph showing the pulse voltage dependence of an error rate of a device according to Example 1 of Test Example 1.

FIGS. 23 and 24 are graphs each showing the pulse voltage dependence of an error rate of the device of this Test Example. FIG. 23 shows results of Comparative Example 1. FIG. 24 shows results of Example 1. Further, in those graphs, the horizontal axis represents a pulse voltage (V), and the vertical axis represents an error rate. Furthermore, (a), (b), and (c) show cases of different pulse widths; (a) shows the case of 30 ns, (b) shows the case of 15 ns, and (c) shows the case of 5 ns.

As shown in FIG. 23, in the device of Comparative Example 1, as the pulse width is shorter, a higher reverse voltage is necessary and the inclination of an error rate curve is gentler. From those results, it was observed that, in order to reliably perform recording with a short pulse using the device of Comparative Example 1, a high reverse voltage is necessary.

Meanwhile, as shown in FIG. 24, in the device of Example 1, as the pulse width is shorter, the reverse voltage rises, but the rise is slight as compared with Comparative Example 1. Furthermore, the inclination of the error rate curve had little change between the short pulse width of (c) and the relatively long pulse width of (a). From those results, it was observed that the device of Example 1 can perform reliable recording with a small voltage as compared with the device of Comparative Example 1.

Test Example 2

Subsequently, the following tests were performed using Example 2 configured as the storage device 20 of the second embodiment described above and Comparative Example 2.

The storage device according to Example 2 was produced as follows.

First, formed was a laminate including: a laminated film of Ta of 5 nm and Ru of 2 nm as the base layer 17; CoPt of 2 nm as the magnetic coupling layer 16; Ru of 0.7 nm as the coupling layer 15; FeCoB of 1 nm as the magnetization fixed layer 14; MgO of 0.7 nm as the intermediate layer 13 (tunnel barrier layer); an FeCoB film of 1.5 nm having a composition of $Fe_{75}Co_{20}B_5$ as the storage layer 22; and a laminated film of Ta of 5 nm as the protective layer 11.

After the laminate described above was then formed into a columnar shape with a diameter of 40 nm, a carbon (C) layer of 2 nm was formed as the light element supply layer 28, and embedding was performed with a protective film made of $SiO_2$, heat treatment was performed at 400° C. by one hour. Further, the device was formed without removing the light element supply layer 28.

Meanwhile, the storage device according to Comparative Example 2 includes, instead of the storage layer 22, an FeCoB film of 1.5 nm having a composition of $Fe_{70}Co_{10}B_{20}$ and does not include a light element supply layer, but other configurations are similar to those of Example 1.

Figure 25:
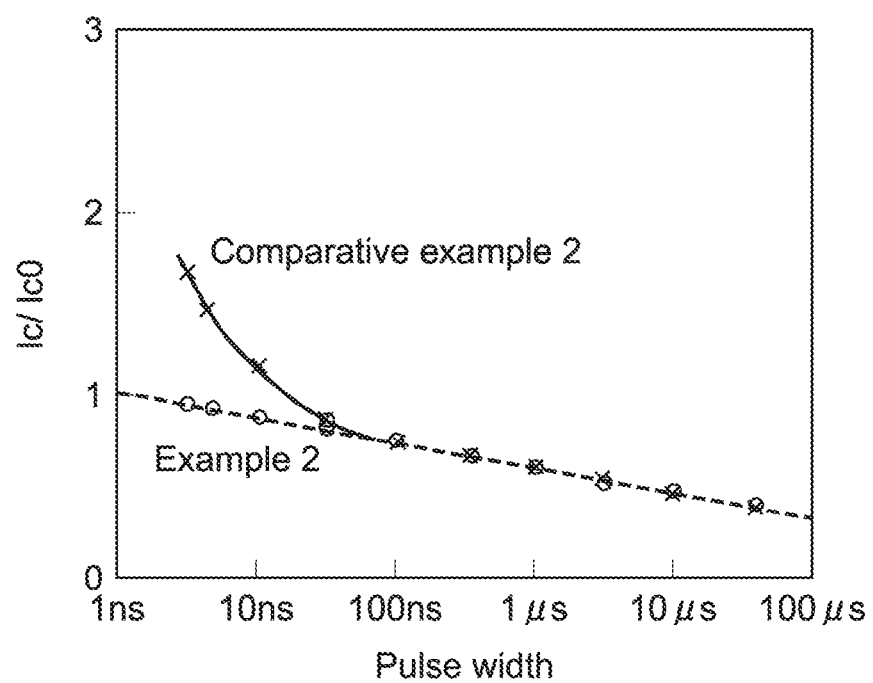
FIG. 25 is a graph showing the pulse width dependence of a standardized reverse current (Ic/Ic0) of devices of Example 2 and Comparative Example 2 in Test Example 2.

FIG. 25 is a graph showing the pulse width dependence of a standardized reverse current (Ic/Ic$_0$) of the devices of Example 2 and Comparative Example 2 in this Test Example.

Here, Ic$_0$ is a value obtained by performing linear approximation on the reverse current with a pulse having a pulse width of 100 ns or more and extrapolation to a pulse width of 1 ns.

In the device of Comparative Example 2, the reverse current drastically increases with a shorter pulse width than 100 ns, and as the pulse width is shorter, the reverse current is more distant from the straight line seen when a pulse width is 100 ns or more.

Meanwhile, in the device of Example 2, a drastic increase in the reverse current is not seen even with a pulse width of 100 ns or less, and the reverse current changes along the straight line seen when a pulse width is 100 ns or more.

From those results, it was observed that the increase in reverse current with a short pulse is suppressed in Example 2.

It should be noted that the present technology can have the following configurations.

(1) A storage device, including:
a magnetization fixed layer that has magnetization in an orientation perpendicular to a film surface and a constant magnetization direction;
an intermediate layer that includes a non-magnetic body and is disposed on the magnetization fixed layer; and
a storage layer that includes an outer circumferential portion and a center portion, is disposed to face the magnetization fixed layer with the intermediate layer sandwiched therebetween, and has a variable magnetization direction, the outer circumferential portion having magnetization in an orientation perpendicular to a film surface, the center portion being formed by being surrounded by the outer circumferential portion and having magnetization inclined from the orientation perpendicular to the film surface.

(2) The storage device according to (1), further including
an oxide layer that includes a first region and a second region, the first region being disposed on the outer circumferential portion and having favorable crystallinity, the second region being disposed on the center portion and having degraded crystallinity relative to that of the first region or being configured as a space, the oxide layer being disposed on the storage layer on the opposite side to the intermediate layer and being capable of making perpendicular magnetic anisotropy of the outer circumferential portion higher than perpendicular magnetic anisotropy of the center portion on the basis of crystallinity of an interface with the storage layer.

(3) The storage device according to (2), in which
the second region of the oxide layer has degraded crystallinity relative to that of the first region.

(4) The storage device according to (3), in which
the second region is formed to be thinner than the first region.

(5) The storage device according to (2), in which
the second region is configured as a space.

(6) The storage device according to (1), in which
the outer circumferential portion has a first thickness, and
the center portion has a second thickness that is thicker than the first thickness.

(7) The storage device according to (1), in which
the outer circumferential portion contains a light element at a first composition ratio, and
the center portion contains the light element at a second composition ratio that is different from the first composition ratio.

(8) The storage device according to (7), in which
the light element contains at least one of B and C, and
the second composition ratio is smaller than the first composition ratio by 5% or more.

(9) The storage device according to (7), in which
the light element contains at least one of O and N, and
the second composition ratio is larger than the first composition ratio by 2% or more.

(10) The storage device according to any one of (1) to (9), in which
the light element contains at least one of O and N, and
the second composition ratio is larger than the first composition ratio by 2% or more.

(11) A manufacturing method for a storage device, the method including:
forming a magnetization fixed layer that has magnetization in an orientation perpendicular to a film surface and a constant magnetization direction;
forming an intermediate layer that includes a non-magnetic body on the magnetization fixed layer;
forming a magnetic body layer having a variable magnetization direction on the intermediate layer; and
forming a storage layer by forming an outer circumferential portion and a center portion in the magnetic body layer, the outer circumferential portion having magnetization in an orientation perpendicular to a film surface, the center portion being formed by being surrounded by the outer circumferential portion and having magnetization inclined from the orientation perpendicular to the film surface.

(12) The manufacturing method for a storage device according to (11), in which
the step of forming a storage layer includes
forming a non-oxide layer on the magnetic body layer, and
performing oxidation treatment on the non-oxide layer to form an oxide layer, the oxide layer including a first region and a second region, the first region being disposed on the outer circumferential portion and having favorable crystallinity, the second region being disposed on the center portion and having degraded crystallinity relative to that of the first region, the oxide layer being disposed on the storage layer on the opposite side to the intermediate layer and being capable of making perpendicular magnetic anisotropy of the outer circumferential portion higher than perpendicular magnetic anisotropy of the center portion on the basis of crystallinity of an interface with the storage layer.

(13) The manufacturing method for a storage device according to (11), in which
the step of forming a storage layer includes
forming an oxide layer on the magnetic body layer,
forming a mask pattern on an upper portion of the oxide layer, and
etching the center of the oxide layer via the mask pattern under a predetermined etching condition.

(14) The manufacturing method for a storage device according to (13), in which
the step of forming a mask pattern includes
forming a first mask pattern including a first mask portion and a second mask portion, the first mask portion being formed on an upper portion of the outer circumferential portion, the second mask portion being formed on an upper portion of the center portion and being thinner than the first mask portion, and the step of etching includes removing the second mask portion and removing at least a part of the oxide layer via the first mask portion.

(15) The manufacturing method for a storage device according to (14), in which the step of forming a mask pattern includes forming a second mask pattern on at least the second mask portion of the first mask pattern under the predetermined condition, the second mask pattern having a higher etching rate than the first mask pattern, and the step of etching includes removing the second mask portion and the second mask pattern on the second mask portion and removing a part of the oxide layer via the first mask portion.

(16) The manufacturing method for a storage device according to (11), in which the step of forming a storage layer includes forming a mask pattern on an upper portion of the center portion, and etching a part of the outer circumferential portion via the mask pattern.

(17) The manufacturing method for a storage device according to (16), further including forming a protective layer on the magnetic body layer after forming the magnetic body layer, in which the step of forming a mask pattern on an upper portion of the center portion includes forming the mask pattern on the protective layer, and the step of etching a part of the outer circumferential portion via the mask pattern includes etching, after forming the mask pattern, at least a part of the protective layer via the mask pattern under a first etching condition, selectively etching the mask pattern to reduce the mask pattern, and etching a part of the outer circumferential portion via the reduced mask pattern under a second etching condition.

(18) The manufacturing method for a storage device according to (11), in which the step of forming a storage layer includes supplying or removing a light element from an outer circumferential surface of the magnetic body layer.

(19) The manufacturing method for a storage device according to (18), in which the step of supplying a light element from an outer circumferential surface of the magnetic body layer includes forming a light element supply layer that covers the outer circumferential surface of the magnetic body layer, and supplying the light element from the light element supply layer to the magnetic body layer.

(20) A storage apparatus, including:

a storage device including a magnetization fixed layer that has magnetization in an orientation perpendicular to a film surface and a constant magnetization direction, an intermediate layer that includes a non-magnetic body and is disposed on the magnetization fixed layer, and a storage layer that includes an outer circumferential portion and a center portion, is disposed to face the magnetization fixed layer with the intermediate layer sandwiched therebetween, and has a variable magnetization direction, the outer circumferential portion having magnetization in an orientation perpendicular to a film surface, the center portion being formed by being surrounded by the outer circumferential portion and having magnetization inclined from the orientation perpendicular to the film surface;

a wiring unit capable of supplying a current flowing in a lamination direction to the storage device; and a current supply control unit capable of controlling supply of a current to the storage device via the wiring unit.

REFERENCE SIGNS LIST 10, 20, 30, 40, 40A storage device
12, 22, 32, 42 storage layer
121, 221, 321, 421 outer circumferential portion
122, 222, 322, 422 center portion
13 intermediate layer
14 magnetization fixed layer
18, 48, 48A oxide layer
181, 481 first region
182, 482, 482A second region
123, 223, 323, 423 magnetic body layer
183 non-oxide layer
M32, M33 mask pattern
M43 first mask pattern
M431 first mask portion
M432 second mask portion
M44 second mask pattern
100 storage apparatus
101 wiring unit
102 current supply control unit

The invention claimed is:

1. A storage device, comprising:
a magnetization fixed layer that has magnetization in a first orientation perpendicular to a film surface of the storage device and a constant magnetization direction;
an intermediate layer that includes a non-magnetic body and is on the magnetization fixed layer; and
a storage layer that faces the magnetization fixed layer with the intermediate layer sandwiched therebetween and has a variable magnetization direction, wherein
the storage layer includes:
an outer circumferential portion having magnetization in a second orientation perpendicular to the film surface; and
a center portion surrounded by the outer circumferential portion and having magnetization inclined from the second orientation perpendicular to the film surface.

2. The storage device according to claim 1, further comprising an oxide layer that includes:
a first region on the outer circumferential portion and having favorable crystallinity; and
a second region on the center portion, wherein the second region has degraded crystallinity relative to that of the first region or the second region is configured as a space,
wherein
the oxide layer is on the storage layer on opposite side to the intermediate layer, and
the oxide layer is configured to make perpendicular magnetic anisotropy of the outer circumferential portion higher than perpendicular magnetic anisotropy of the center portion based on crystallinity of an interface with the storage layer.

3. The storage device according to claim 2, wherein the second region is thinner than the first region.

4. The storage device according to claim 2, wherein the second region is configured as the space.

5. The storage device according to claim 1, wherein the outer circumferential portion has a first thickness, and the center portion has a second thickness thicker than the first thickness.

6. The storage device according to claim 1, wherein
the outer circumferential portion comprises a light element at a first composition ratio, and
the center portion comprises the light element at a second composition ratio different from the first composition ratio.

7. The storage device according to claim 6, wherein
the light element comprises at least one of B and C, and
the second composition ratio is smaller than the first composition ratio by 5% or more.

8. The storage device according to claim 6, wherein
the light element comprises at least one of O and N, and
the second composition ratio is larger than the first composition ratio by 2% or more.

9. The storage device according to claim 1, wherein the storage layer has a horny ratio of 0.7 or more and less than 1.

10. A storage apparatus, comprising:
a storage device including:
a magnetization fixed layer that has magnetization in a first orientation perpendicular to a film surface of the storage device and a constant magnetization direction;
an intermediate layer that includes a non-magnetic body and is on the magnetization fixed layer; and
a storage layer that faces the magnetization fixed layer with the intermediate layer sandwiched therebetween and has a variable magnetization direction, wherein
the storage layer includes:
an outer circumferential portion having magnetization in a second orientation perpendicular to the film surface; and
a center portion surrounded by the outer circumferential portion and having magnetization inclined from the second orientation perpendicular to the film surface;
a wiring unit configured to supply a current flowing in a lamination direction to the storage device; and
a current supply control unit configured to control supply of a current to the storage device via the wiring unit.

* * * * *